(12) United States Patent
Vereen et al.

(10) Patent No.: US 9,419,217 B2
(45) Date of Patent: Aug. 16, 2016

(54) VERTICAL CROSS-POINT MEMORY ARRAYS

(75) Inventors: Lidia Vereen, San Ramon, CA (US);
Bruce Bateman, Fremont, CA (US);
David Eggleston, San Jose, CA (US);
Louis Parrillo, Austin, TX (US)

(73) Assignee: UNITY SEMICONDUCTOR CORPORATION, Sunnyvale, CA (US)

( * ) Notice: Subject to any disclaimer, the term of this patent is extended or adjusted under 35 U.S.C. 154(b) by 346 days.

(21) Appl. No.: 13/586,094

(22) Filed: Aug. 15, 2012

(65) Prior Publication Data
US 2013/0210211 A1 Aug. 15, 2013

Related U.S. Application Data

(60) Provisional application No. 61/523,820, filed on Aug. 15, 2011, provisional application No. 61/536,515, filed on Sep. 19, 2011.

(51) Int. Cl.
*H01L 21/20* (2006.01)
*H01L 45/00* (2006.01)
*H01L 27/24* (2006.01)

(52) U.S. Cl.
CPC .......... *H01L 45/1233* (2013.01); *H01L 27/249* (2013.01); *H01L 27/2454* (2013.01); *H01L 45/08* (2013.01); *H01L 45/1226* (2013.01); *H01L 45/146* (2013.01); *H01L 45/147* (2013.01); *H01L 45/1616* (2013.01)

(58) Field of Classification Search
CPC ................................................. H01L 45/1233
USPC ........................... 257/4, 5, 208, 211; 438/382
See application file for complete search history.

(56) References Cited

U.S. PATENT DOCUMENTS

| 8,187,936 | B2 | 5/2012 | Alsmeier et al. |
| 2002/0079586 | A1* | 6/2002 | Uchiyama ......... H01L 21/76807 257/758 |
| 2004/0017691 | A1* | 1/2004 | Luk .......................... G11C 7/065 365/149 |
| 2006/0146608 | A1* | 7/2006 | Fasoli et al. .............. 365/185.17 |
| 2008/0157127 | A1* | 7/2008 | Bertin et al. .................. 257/209 |
| 2010/0140685 | A1* | 6/2010 | Kang et al. .................... 257/324 |
| 2010/0259962 | A1* | 10/2010 | Yan et al. ......................... 365/51 |
| 2012/0087183 | A1* | 4/2012 | Chang ............................ 365/163 |

OTHER PUBLICATIONS

HP Datasheet, HP Pavilion dv7-7012nr Entertainment PC, Product No.: B2P31UA#ABA, ad embargo date of Apr. 29, 2012. 2 pages.

* cited by examiner

*Primary Examiner* — John C Ingham
*Assistant Examiner* — Ismail Muse
(74) *Attorney, Agent, or Firm* — Lowenstein Sandler LLP

(57) ABSTRACT

A method of manufacturing a memory structure includes forming a plurality of vertically-stacked horizontal line layers, interleaving a plurality of electrically conductive vertical lines with the electrically conductive horizontal lines, and forming a memory film at and between intersections of the electrically conductive vertical lines and the horizontal lines. In one embodiment of the invention, the electrically conductive vertical lines are interleaved with the horizontal lines such that a row of vertical lines is positioned between each horizontally-adjacent pair of horizontal lines in each horizontal line layer. By configuring the electrically conductive vertical lines and electrically conductive horizontal lines so that a row of vertical lines is positioned between each horizontally-adjacent pair of horizontal lines, a unit memory cell footprint of just $2F^2$ may be realized.

17 Claims, 31 Drawing Sheets

READ OPERATION $V_R < V_P$
$V_R < |V_E|$

PROGRAM OPERATION $V_P > V_R$

ERASE OPERATION (e.g., $V_E = -V_P$ for a bipolar memory cell
or
$V_E > V_P$ for unipolar memory cell)

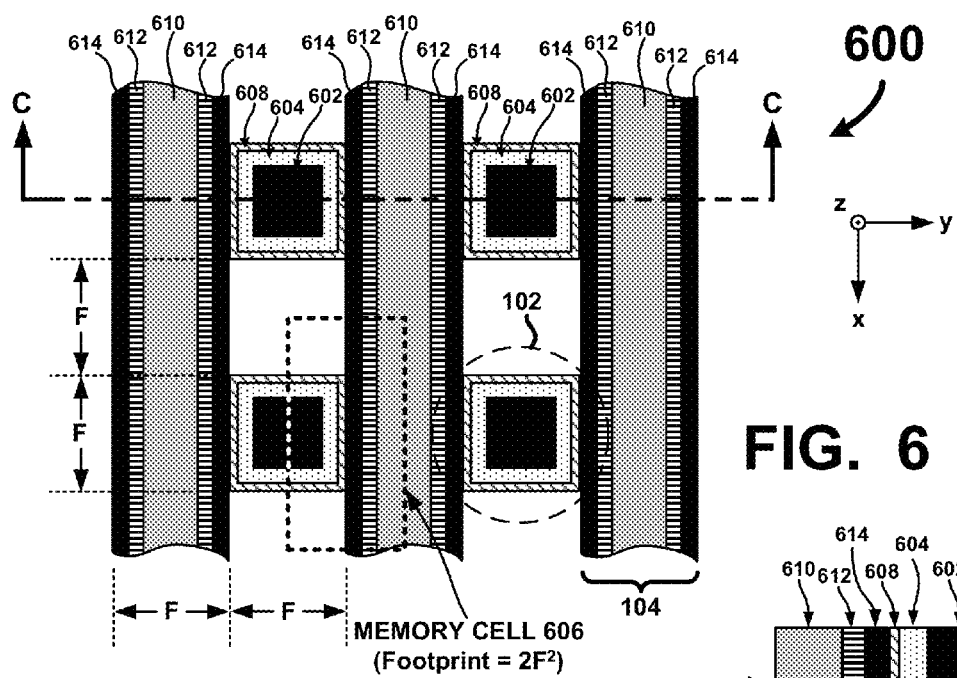
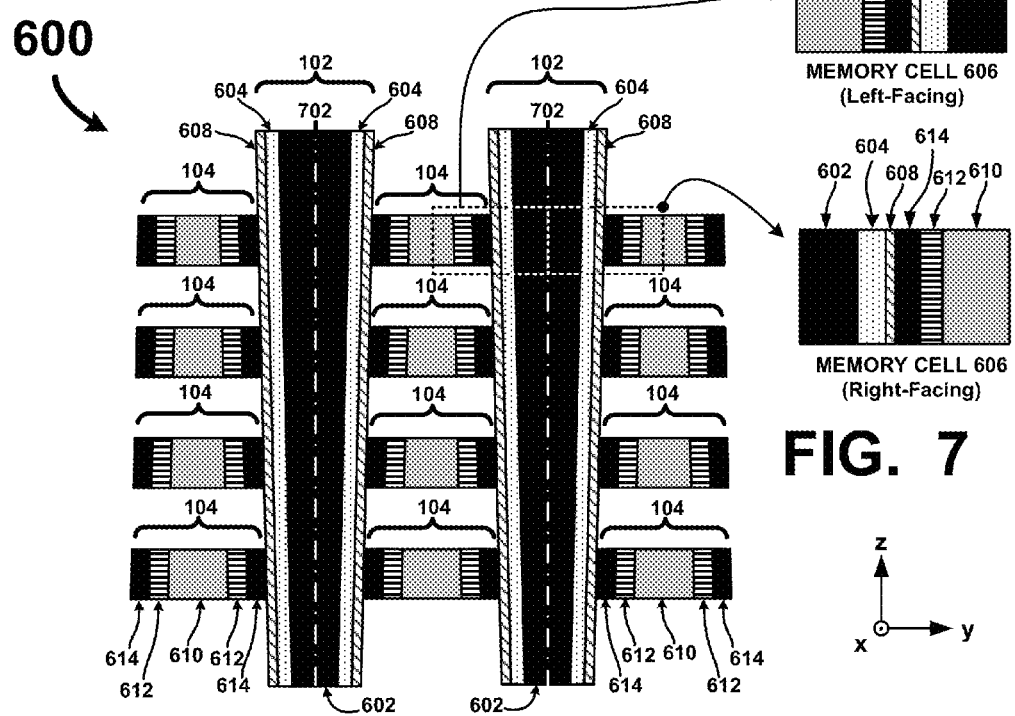
FIG. 6
FIG. 7

ERASED STATE

PROGRAMMED STATE

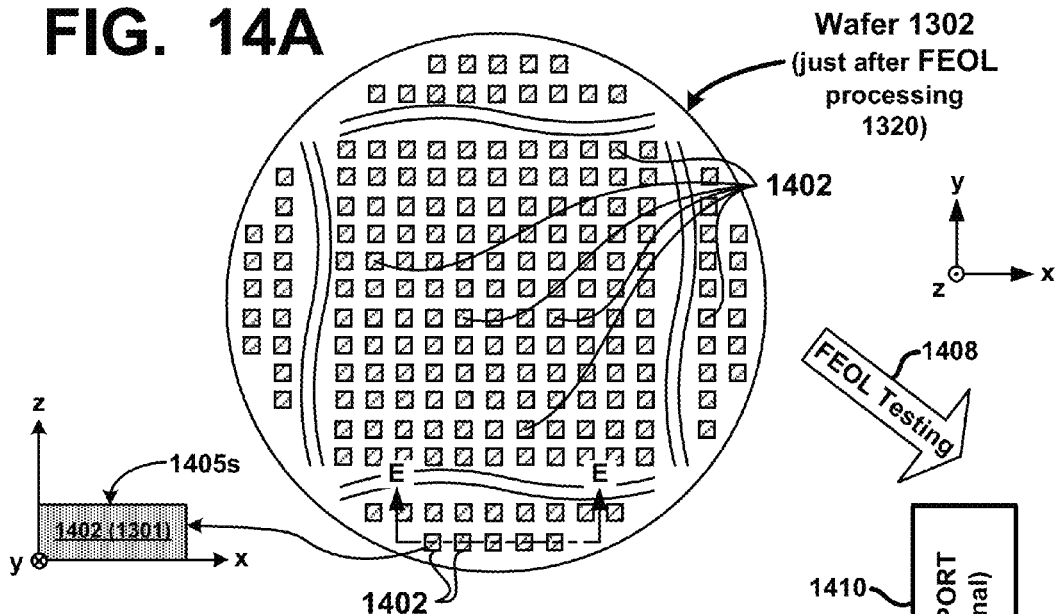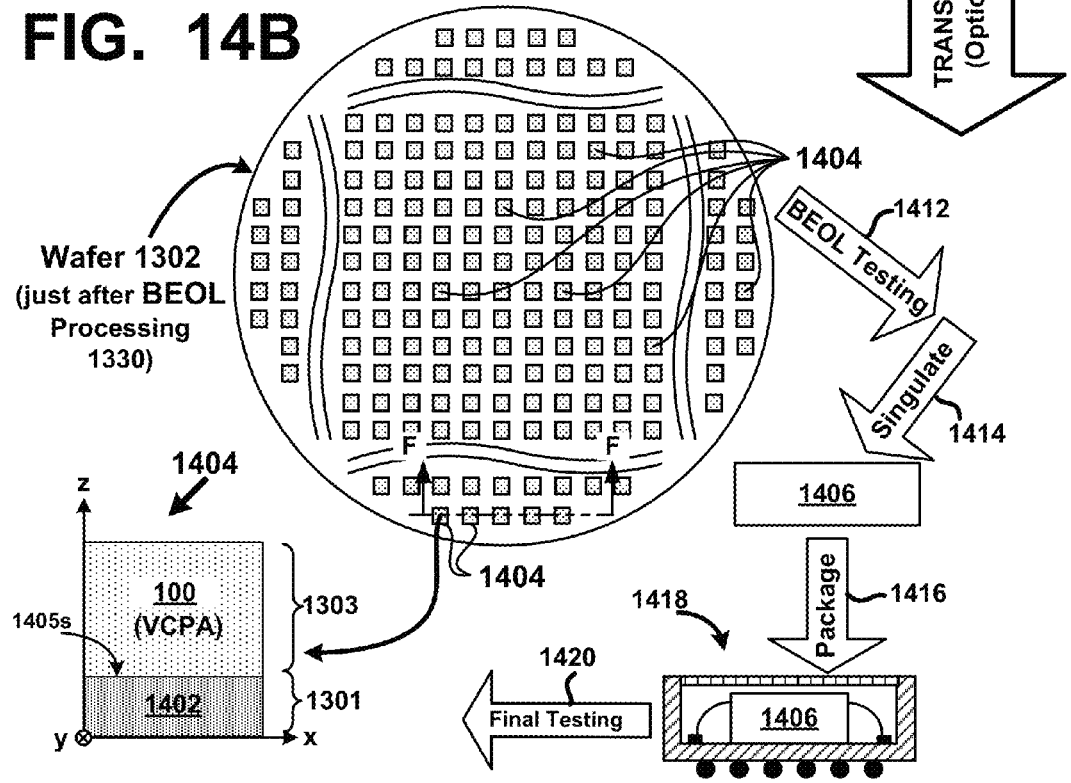

VERTICAL CROSS-POINT MEMORY ARRAYS

CROSS-REFERENCE TO RELATED APPLICATIONS

This application claims the benefit of U.S. Provisional Application No. 61/523,820, filed Aug. 15, 2011, and U.S. Provisional Application No. 61/536,515, filed Sep. 20, 2011, both of which are incorporated herein by reference in their entirety.

BACKGROUND

Non-volatile memory is widely used in portable electronic devices (e.g., smart phones, personal digital assistants, tablet and notebook computers, digital cameras, digital audio players, etc.). Non-volatile memory retains its stored information even in the absence of power. It is also electrically erasable and reprogrammable, light-weight and durable, and requires no moving parts. All of these attributes lend well for use in portable electronic devices.

To satisfy increasing demand for higher-capacity flash memory while keeping manufacturing costs low, flash memory manufacturers have resorted to process scaling techniques in which the memory cells that make up the flash memory—known as "floating gate transistors"—are fabricated with smaller dimensions. By scaling down (i.e., "shrinking") the individual floating gate transistors, higher capacity flash memories can be produced. Over the years, process scaling has proved to be remarkably successful, reducing the minimum feature size of floating gate transistors from around 1 micron (1,000 nanometers) in the early 1990s to around 25 nanometers today. However, the ability to scale down further is impeded by diffraction limits of the photolithography processes used in fabricating the floating gate transistors and by short channel effects and memory retention problems that arise when floating gate transistors are scaled down to nanometer dimensions.

To overcome these limitations, various alternative non-volatile memory technologies have been proposed. Some of these alternative non-volatile memory technologies have shown great promise. However, challenges to manufacturing the memory cells in a high-density array remain. The present invention addresses and provides solutions to these challenges.

BRIEF DESCRIPTION OF THE DRAWINGS

Features and advantages of the present invention, as well as the structure and operation of various embodiments of the present invention, are described in detail below with respect to accompanying drawings, which are not necessarily to scale and in which like reference numbers are used to indicate identical or functionally similar elements.

FIG. 6 is a sectional view of a VCPA formed from conductive metal oxide based (CMO-based) memory elements, according to one embodiment of the present invention;

FIG. 7 is a sectional view of the CMO-based VCPA in FIG. 6 through cutting plane C-C;

FIG. 14A depicts a wafer immediately following the performing of an FEOL semiconductor manufacturing;

FIG. 14B depicts the same wafer as in FIG. 14A immediately following the performing of a back-end of the line (BEOL) vertical manufacturing process on die from the FEOL manufacturing process of FIG. 14A;

DETAILED DESCRIPTION

Figure 1:
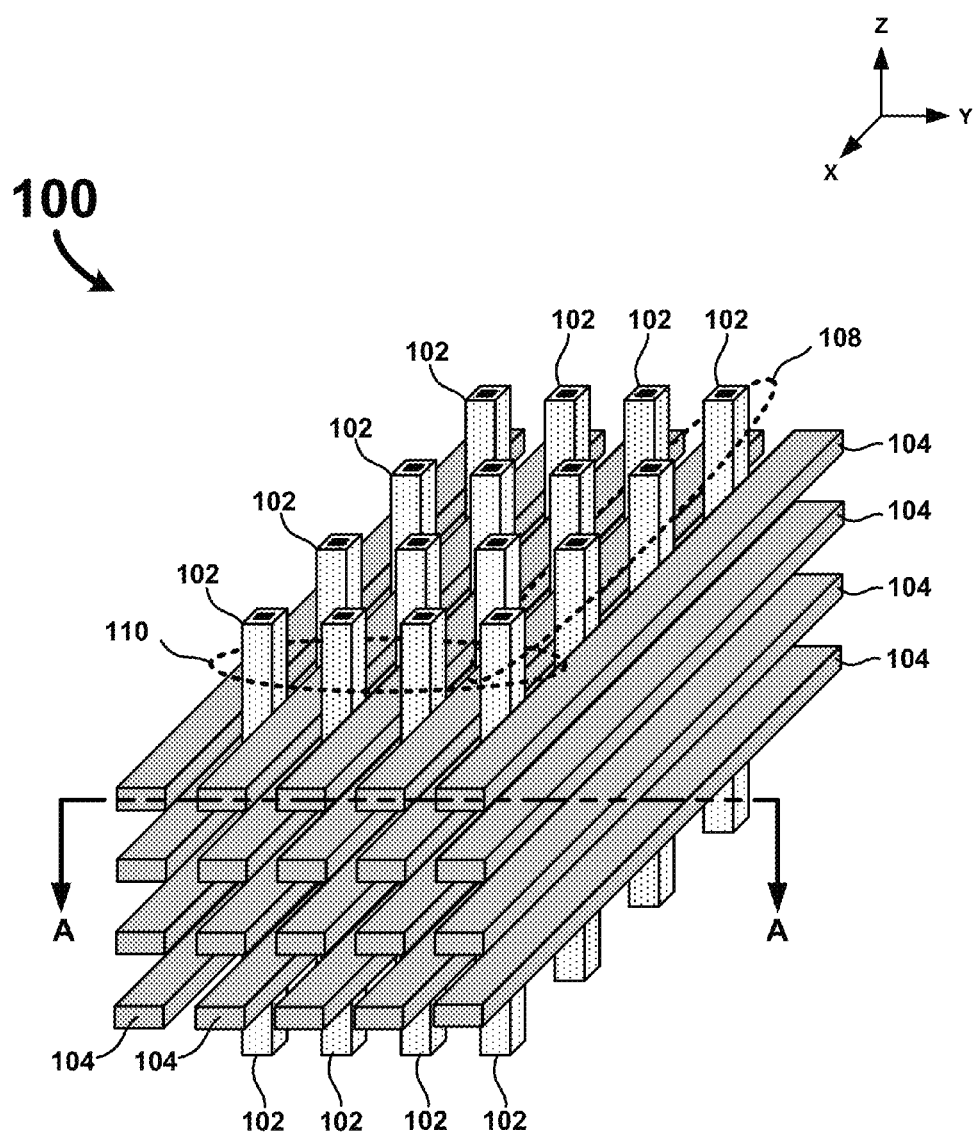
FIG. 1 is a perspective drawing depicting a vertical cross-point array (VCPA) formed from two-terminal memory elements, according to an embodiment of the present invention.
Figure 2:
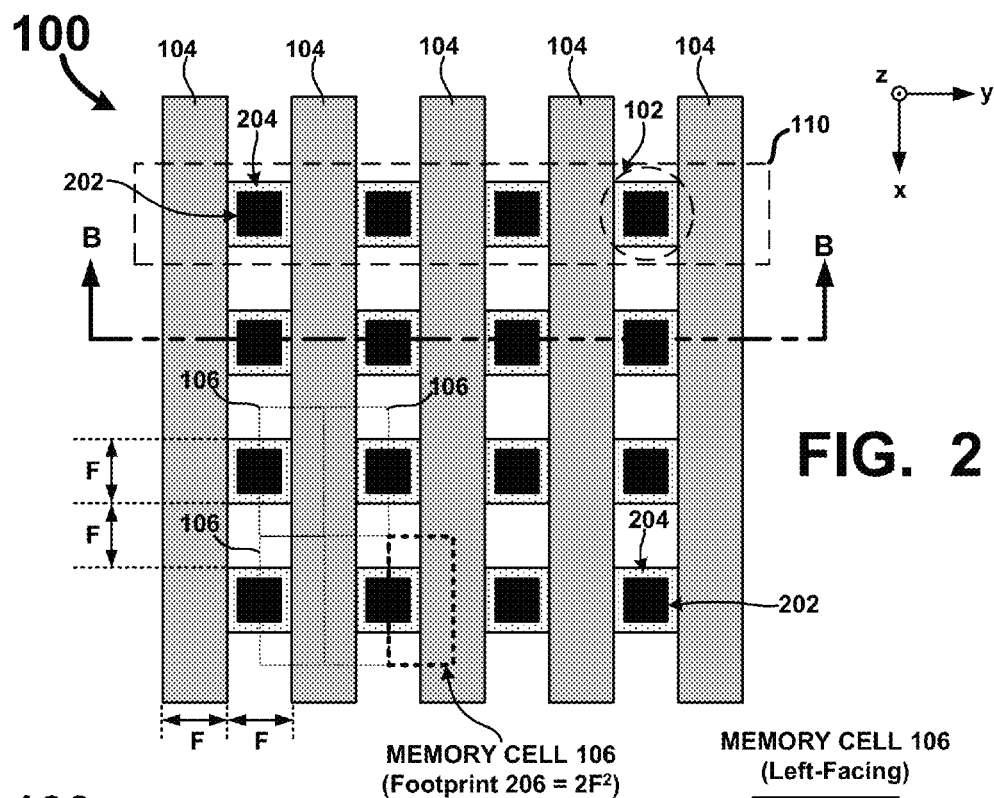
FIG. 2 is a sectional view of the VCPA in FIG. 1 through cutting plane A-A.
Figure 3:
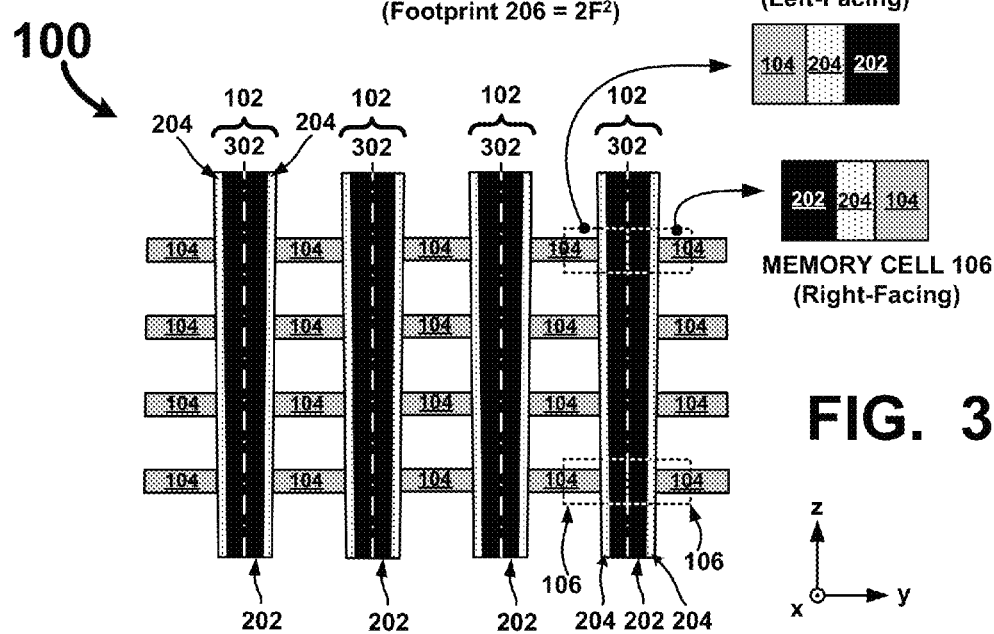
FIG. 3 is a sectional view of the VCPA in FIGS. 1 and 2 through cutting plane B-B.

Referring first to FIGS. 1-3, there is shown a vertical cross-point array (VCPA) 100 manufactured in accordance with an embodiment of the present invention. The VCPA 100 comprises a plurality of vertical lines 102 extending in the Z-direction, a plurality of horizontal line layers containing a plurality of electrically conductive horizontal lines 104 extending perpendicularly with respect to the vertical lines 102 (e.g., in the X-direction in this example), and a plurality of memory cells 106 (i.e., memory "cells") formed in regions where the vertical and horizontal lines 102 and 104 cross. The vertical lines 102 are arranged in a grid pattern with a plurality of rows 108 (X-direction) and columns 110 (Y-direction) of vertical lines 102 interleaved with the horizontal lines 104, such that a row 108 of vertical lines 102 is configured between each consecutive pair of horizontal lines 104. In another embodiment, rows 108 of vertical lines 102 are interleaved with the horizontal lines 104, such that a row 108 of vertical lines 102 is positioned between every other consecutive pair of horizontal lines 104.

As can be seen more clearly in FIG. 2, which is a sectional view of the VCPA 100 through cutting plane A-A in FIG. 1, and FIG. 3 which is sectional view of the VCPA 100 through cutting plane B-B in FIG. 2, each vertical line 102 comprises an inner (i.e., center) conductor 202 surrounded by (or coated in part (i.e., partially coated) in an alternative embodiment) by at least one memory film 204, for example, one or more resistive change memory films. The memory film 204 is disposed between the center conductors 202 of the vertical lines 102 and the crossing horizontal lines 104, such that the center conductor 202 of each vertical line 104 serves as a shared first terminal for memory cells 106 facing left with respect to the centerline 302 of the vertical line 102 (i.e., "left-facing" memory cells) and also as a shared first terminal for memory cells 106 facing right with respect to the centerline 302 (i.e., "right-facing" memory cells). Each horizontal line 104 that crosses the vertical line 102 serves as second terminal of a memory cell 106 formed between the horizontal line 104 and the center conductor 202 of the vertical line 102. In other words, a memory cell 106 is integrally formed between each horizontal line 104 and the center conductor 202 of each vertical line 102 that the horizontal line 104 crosses. (It should be mentioned that although the memory film 204 in this exemplary embodiment is formed on the outer surfaces of the vertical lines 102, in other embodiments of the invention, the memory film comprises part of or is formed along the edges of the horizontal lines 104, instead.)

Figure 4:
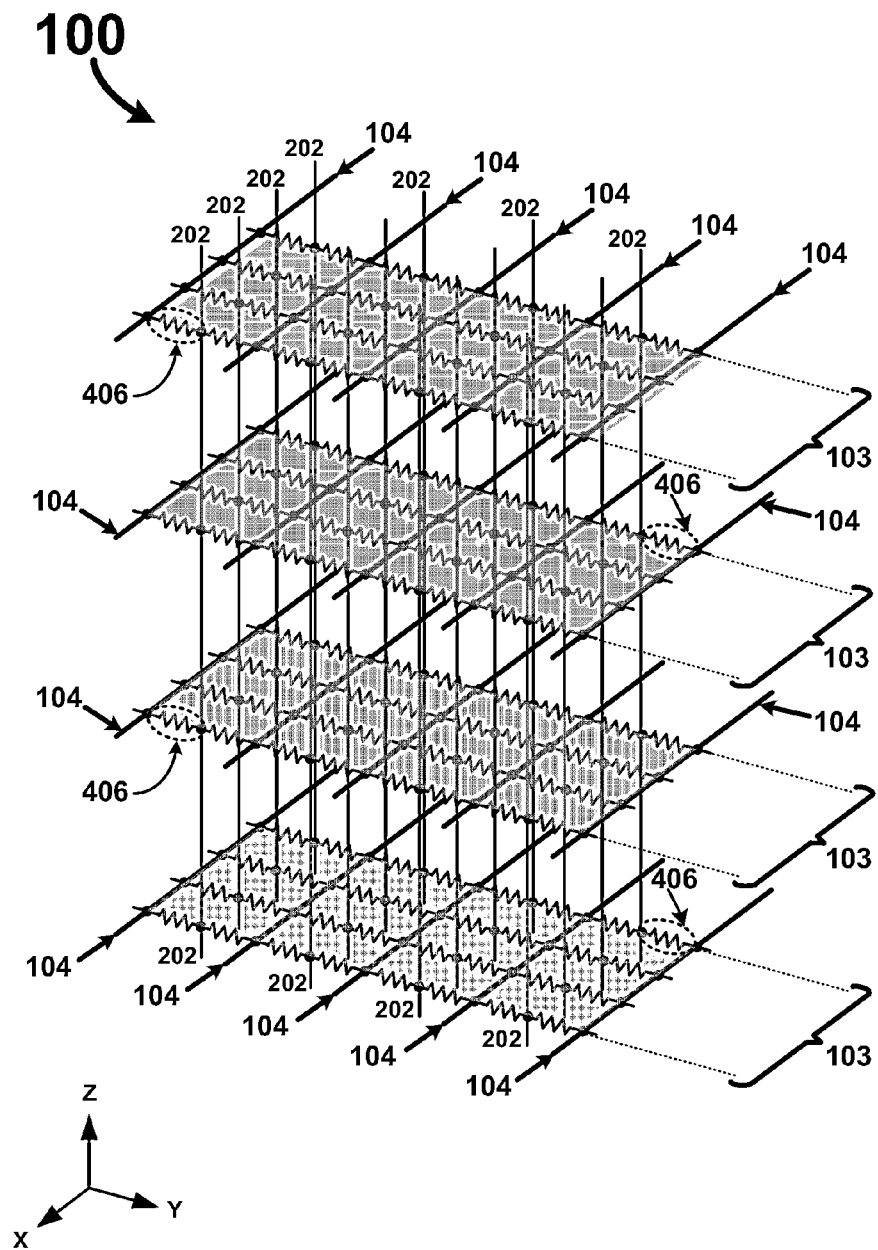
FIG. 4 is a schematic perspective view of a VCPA formed from two-terminal memory elements, according to an embodiment of the present invention.

FIG. 4 is a schematic perspective view of the VCPA 100 when formed with two-terminal resistive change memory cells 406. Each resistive change memory cell 406 is seen to be positioned between a unique center conductor 202 and horizontal line 104 pair. (As discussed in more detail below, the center conductors 202 can be configured to serve as bitlines (or "local bitlines) and the horizontal lines 104 can be configured to serve as wordlines for the VCPA 100.) Further, in each memory layer 103 and each left-to-right rank 110 (see FIGS. 1 and 2) of vertical lines 102 (i.e., each column), a resistive change memory cell 406 is configured between each horizontal line 104 and the center conductor 202 of each adjacent vertical line 102. In other words, memory cell connections are formed on both sides of each horizontal line 104.

It should be mentioned that although the VCPA 100 in FIG. 4 has been described as being formed from resistive change memory cells 406 in this exemplary embodiment, it could alternatively be formed from other types of memory cells, whether based on resistive states or some other memory storing mechanism, whether re-writable or not, and/or whether volatile or non-volatile. For example, the memory cells 106 may alternatively comprise phase-change (e.g., chalcogenide-based) memory cells, magnetoresistive (i.e., ferromagnetic) memory cells, ferroelectric memory cells, conductive bridge memory cells, carbon nanotube memory cells, fuse-based memory cells, anti-fuse-based memory cells, or other type of memory cells.

It should also be mentioned that whereas the VCPA 100 is shown to include only five horizontal lines 104 per memory layer 103 and only a four-by-four grid (row×column) of vertical lines 102, this is done to ease illustration. In an actual implementation, the VCPA 100 and other VCPAs described herein would typically have many more horizontal lines 104 per memory layer 103 (e.g., hundreds or thousands or more) and many more vertical lines 102 (e.g., hundreds or thousands or more). Further, whereas the VCPA 100 is depicted as having only four memory layers 103 (i.e., a memory "stack" of only four memory layers 103) the memory stack of the VCPA 100 and other VCPAs disclosed herein may be fabricated to have less than four or more than four memory layers 103, and typically would have tens or hundreds of memory layers 103.

Figure 5A:
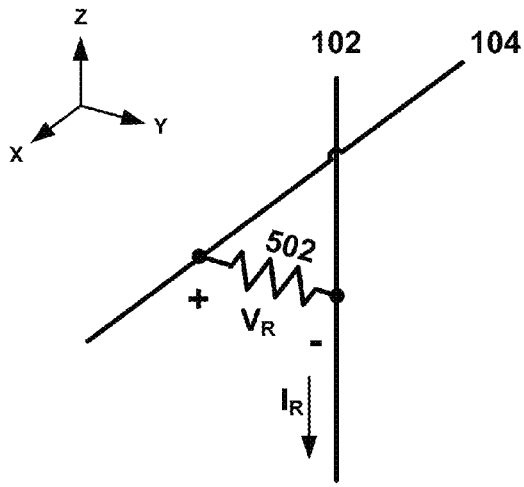
FIGS. 5A-C are schematic drawings depicting how a selected two-terminal memory elements of the VCPA in FIG. 4 is read, programmed, and erased, respectively.
Figure 5B:
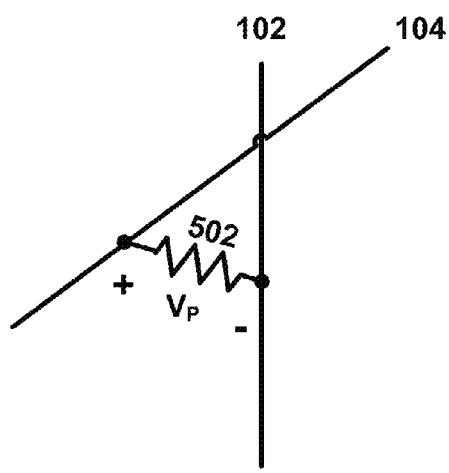
Figure 5C:
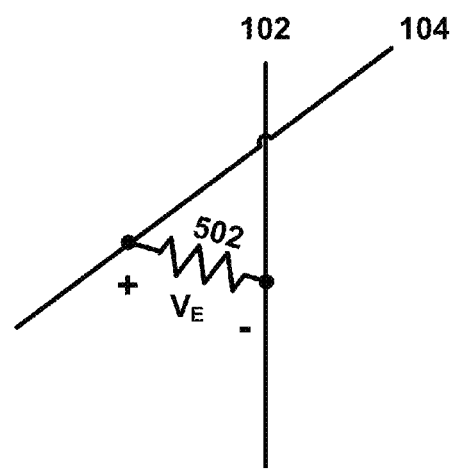

Because each resistive change memory cell 406 is associated with a unique center conductor 202 and horizontal line 104 pair, it is possible (although not necessary) to perform data operations (i.e., read, write, program, erase, and restore operations) on any single resistive change memory cell 406 in the VCPA 100. FIGS. 5A-C are drawings illustrating how data operations may be performed on a "selected" resistive change memory cell 502. As will be understood by those of ordinary skill in the art, the selected resistive change memory cell 502 is selected by a decoder (not shown) which decodes an address identifying the particular vertical and horizontal lines 102 and 104 in the VCPA 100 between which the selected resistive change memory cell 502 is disposed. The decoder and other active circuitry used to exercise and control the VCPA 100 are fabricated prior to fabrication of the VCPA 100 in a front-end of the line (FEOL) semiconductor manufacturing process, and the memory cells 406 of the VCPA 100 are fabricated in accordance with a back-end of the line (BEOL) process, over the pre-fabricated FEOL structure, as will become more apparent in the description that follows. To read the selected resistive change memory cell 502 (FIG. 5A), the horizontal line 104 and the center conductor 202 of the vertical line 102 between which the selected resistive change memory cell 502 is disposed are biased so that a read voltage $V_R$ is dropped across the selected resistive change memory cell 502. The read voltage $V_R$ has a magnitude sufficient to generate a measurable read current $I_R$ through the selected resistive change memory cell 502 but not so high as to alter the stored memory state of the cell 502. The read current $I_R$ has a value that depends on the resistance of the selected resistive change memory cell 502. Accordingly, when the selected resistive change memory cell 502 is in a high-resistance state, the resulting read current $I_R$ is less than when the selected resistive change memory cell 502 is in a low-resistance state. The different resistive states (i.e., low- or high-resistance states) are therefore indicative of the stored memory state (e.g., a logic "0" or logic "1") of the selected resistive change memory cell 502, i.e., are indicative of whether the selected resistive change memory cell 502 is in a "programmed" state or an "erased" state. The read current $I_R$ or other related signal is directed vertically along the center conductor 202 of the selected vertical line 102 to a sense amplifier or other measuring circuit, which based on the received read current $I_R$ or other related signal electrically determines the stored memory state of the selected resistive change memory cell 502, e.g., a logic "0" or a logic "1".

FIG. 5B depicts how a selected memory cell 502 is programmed. Here, a "programmed" state is defined as corresponding to a high-resistance state and an "erased" state is been defined as corresponding to a low-resistance state. However, these definitions could be reversed, as will be appreciated by those of ordinary skill in the art. To program the selected memory cell 502, a program signal $V_P$ is applied across the horizontal line 104 and the center conductor 202 of the vertical line 102 between which the selected resistive change memory cell 502 is disposed. In one embodiment of the invention, the program signal $V_P$ comprises one or more programming pulses having magnitudes greater than the read voltage $V_R$ and sufficient to alter the resistance of the selected resistive change memory cell 502. The magnitude, duration and/or frequency of the programming pulses are controlled to change the resistance of the selected resistive change memory cell 504 to the desired high-resistance, programmed state.

How a selected resistive change memory cell 502 is erased (FIG. 5C) depends on whether the selected resistive change memory cell 502 has unipolar or bipolar switching characteristics. The VCPA 100 may be configured to utilize resistive change memory cells having either type of switching characteristic. For a resistive change memory cell 502 having bipolar switching characteristics, an erase signal $V_E$ comprising one or more erase pulses opposite in polarity to that of the programming pulses of the program signal $V_P$ is applied across the center conductor 202 and horizontal line 104 so that the erase pulses are dropped across the selected resistive change memory cell 502. For a resistive change memory cell 502 having unipolar switching characteristics, the polarity of the erase pulses are of the same polarity as the programming pulses but have magnitudes greater than the magnitude of the read voltage $V_R$ but different (i.e., less than or greater than) the magnitudes of the programming pulses. Some types of memory cells have both unipolar and bipolar switching characteristics, in which case erasing may be performed using either a unipolar or bipolar operation. Whether erasing is performed in a unipolar or bipolar fashion, the magnitude, duration and/or frequency of the erase pulses are controlled so that the resistance of the selected resistive change memory cell 502 is altered to conform to the desired low-resistance, erased state.

It should be noted that the vertical and horizontal lines associated with "unselected" memory cells (i.e., those memory cells in the VCPA 100 having no horizontal line or vertical line in common with either the horizontal line or vertical line of a selected memory cell) and the vertical and horizontal lines of "half-selected" and "partially-selected" memory cells (i.e., memory cells that directly share either the same vertical line or same horizontal line as the selected memory cell or are indirectly electrically connected to one of the vertical or horizontal lines of a selected memory cell) that are not shared with the selected memory cell may be grounded or biased to some other potential (e.g., a floating voltage potential) to prevent or inhibit leakage currents from the half-selected or partially-selected memory cells from interfering with the read current $I_R$ read operation. Horizontal and/or vertical lines of un-selected, half-selected and partially-selected memory cells may also be biased to ground or some other potential during write operations (i.e., program and erase operations) to prevent or inhibit the resistive states of un-selected, half-selected and partially-selected memory cells from being altered or disturbed during the write operations. Further details concerning methods that may be used or readily adapted to bias unselected, half-selected and partially-selected memory cells during data operations are provided in pending U.S. patent application Ser. No. 12/657,911, filed on Jan. 29, 2010 and entitled "Local Bit Lines and Methods of Selecting the Same to Access Memory Elements in Cross-Point Arrays," which is hereby incorporated by reference in its entirety for all purposes.

It should also be mentioned that although data operations have been described as being performed on a single selected resistive change memory cell, data operations may also or alternatively be performed on a plurality of memory cells simultaneously. For example, in other embodiments of the invention, read and program operations may be alternatively performed on a bit, nibble, byte, word, page, block or other higher bit basis and erase operations may be performed on a block of memory cells or other smaller group of memory cells simultaneously, similar to as in Flash memory. Further, although programming and erasing has been described as comprising altering the resistance of a selected resistance change memory cell 406 between two distinct resistive states—one representing a logic "0" and the other a logic "1"—in other embodiments of the invention the resistance change memory cells 406 are configured as multi-level cells (MLCs). When configured as MLCs, selected resistive change memory cells 406 are configurable to more than two resistive states, each resistive state corresponding to one of several stored memory states. For example, each of the resistance change memory cells 406 may be configurable to four different resistive states corresponding to four distinct storage states: a hard programmed state "00", a soft programmed state "01", a hard erased state "11" and a soft erase state "10."

Any type of resistive change memory cell 406 may be used to implement the memory cells 106 of the VCPA 100 described in FIGS. 1-4 above. FIGS. 6 and 7 are sectional drawings similar to the sectional drawings in FIGS. 2 and 3, depicting how conductive metal oxide (CMO)-based memory cells 606 (a type of resistive change memory cell, which may also be referred to as a tunnel resistive random-access memory element or "tunnel RRAM" element) are used to form a VCPA 600. FIG. 6 is a sectional view of the VCPA 600 in the x-y plane and FIG. 7 is sectional view of the VCPA 600 in through cutting plane C-C in FIG. 6. Each vertical line 102 comprises a center conductor 602 surrounded by an inner CMO layer 604 and an outer insulating metal oxide (IMO) layer 608 (or an inner IMO layer and an outer CMO layer). In an alternative embodiment, instead of comprising part of the vertical lines 102, one or both of the CMO and IMO layers 604 and 608 comprise part of or is/are formed along the edges of the horizontal lines 104.

The center conductor 602 of each vertical line 102 in the VCPA 100 is electrically conductive and serves as a first electrode for memory cells 606 associated with that vertical line 102. Each horizontal line 104 comprises a conductive line 610 bounded on both sides by an inner diffusion barrier layer 612, which serves to prevent oxygen diffusion out of the CMO and IMO layers 604 and 608, and an outer edge electrode layer 614. The horizontal lines 104 are interleaved with the vertical lines 102 such that the edge electrode layers 614 of the horizontal lines 104 are in contact with the IMO layers 604 of the vertical lines 102 at the junctions where the horizontal lines 104 and vertical lines 102 cross. This configuration results in CMO-based memory cells 606 having CMO and IMO layers 604 and 608 disposed between the center conductors 602 of the vertical lines 102 and the edge electrodes 614 of the crossing horizontal lines 104. Similar to as in the VCPA 100 above, the CMO-based memory cells 606 are formed on both sides of the centerline 702 of each vertical line 102, as can best be seen in FIG. 7. In other words, "left-facing" CMO-based memory cells are formed to the left of the centerline 702 and "right-facing" CMO-based memory cells are formed to the right of the centerline 702. Vertical lines 102 are also positioned between every consecutive pair of horizontal lines 104, like the VCPA 100, so that a footprint of $2F^2$ is realized.

The CMO layer 604 of the CMO-based memory cell 606 is an ionic conductor that can have an amorphous, crystalline, single crystalline, or polycrystalline structure, or a structure that comprises a combination of those structures. It may comprise, but is not limited to, a manganite, a perovskite selected from one or more of the following: $PrCaMnO_X$ (PCMO), $LaNiO_X$ (LNO), $SrRuO_X$ (SRO), $LaSrCrO_X$ (LSCrO), $LaCaMnO_X$ (LCMO), $LaSrCaMnO_X$ (LSCMO), $LaSrMnO_X$ (LSMO), $LaSrCoO_X$ (LSCoO), and $LaSrFeO_X$ (LSFeO), where x is nominally 3 for perovskites (e.g., x≤3 for perovskites), or a conductive binary oxide comprised of a binary metal oxide having the form $A_XO_Y$, where A represents a metal and O represents oxygen. The conductive binary oxide material may optionally be doped (e.g., with niobium Nb, fluorine F, and/or nitrogen N) to obtain the desired conductive properties for the CMO. The IMO layer 608 is an ionic conductor and an electronic insulator, and serves as an electrolytic tunnel barrier that is permeable to oxygen ions during write (i.e., program and erase) operations. It may comprise, but is not limited to, one or more of the following materials: high-k dielectric materials, rare earth oxides, rare earth metal oxides, yttria-stabilized zirconium (YSZ), zirconia ($ZrO_X$), yttrium oxide ($YO_X$), erbium oxide ($ErO_X$), gadolinium oxide ($GdO_X$), lanthanum aluminum oxide ($LaAlO_X$), and hafnium oxide ($HfO_X$), aluminum oxide ($AlO_X$), silicon oxide ($SiO_X$), ceria oxide ($CeO_X$), and equivalent materials. Further details concerning the materials and properties of CMO-based memory cells are described in U.S. patent application Ser. No. 11/095,026, filed Mar. 30, 2005, and published as U.S. Pub. No. 2006/0171200, and entitled "Memory Using Mixed Valence Conductive Oxides;" U.S. patent application Ser. No. 12/653,836, filed Dec. 18, 2009, and published as U.S. Pub. No. 2010/0157658, and entitled "Conductive Metal Oxide Structures In Non-Volatile Re-Writable Memory Devices;" U.S. patent application Ser. No. 11/881,496, filed Jul. 26, 2007, now U.S. Pat. No. 7,897,951, and entitled "Continuous Plane Of Thin-Film Materials for A Two-Terminal Cross-Point Memory;" and U.S. Pat. No. 8,003,551, issued on Aug. 23, 2011, and entitled "Memory Cell Formation Using Ion Implant Isolated Conductive Metal Oxide;" all of which are hereby incorporated by reference in their entirety and for all purposes.

Figure 8A:
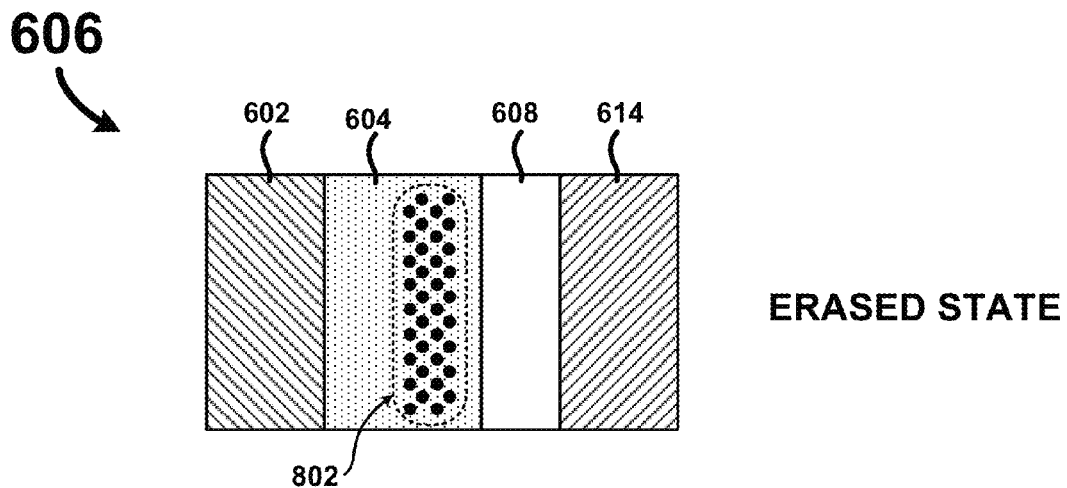
FIGS. 8A and 8B are sectional drawings of a CMO-based memory element of the VCPA in FIG. 6 configured in an erased state and a programmed state, respectively.
Figure 8B:
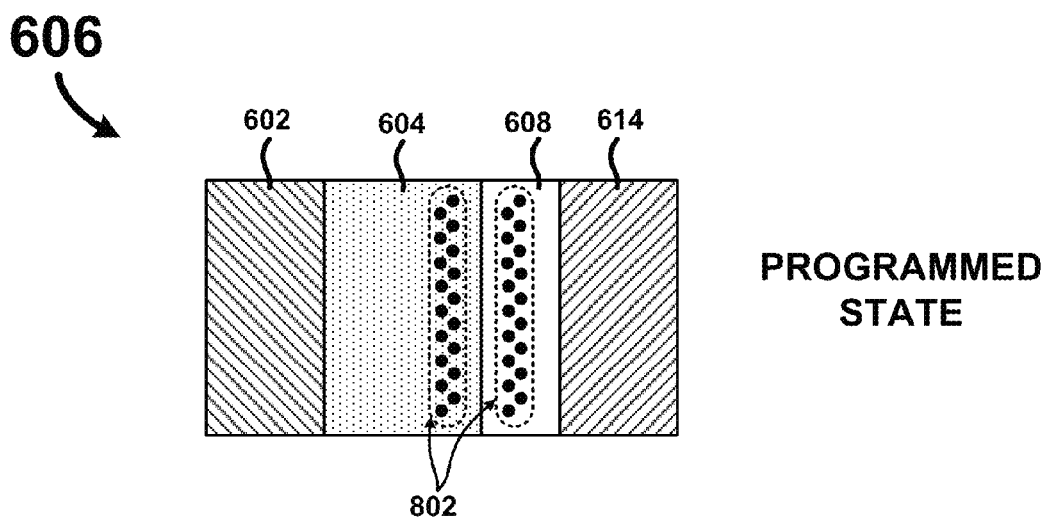

FIGS. 8A and 8B are cross-sectional drawings depicting the CMO-based memory cell 606 in an erased state and a programmed state, respectively. When in an erased state (FIG. 8A), negatively-charged oxygen ions, i.e., oxygen anions 802 (denoted by the small black-filled circles), are mostly concentrated in the CMO layer 604 and the CMO-based memory cell 606 exhibits a low resistance to current (i.e., is in a low-resistance state). Conversely, when in a programmed state (FIG. 8B), the negatively-charged oxygen ions 802 are distributed more evenly between the CMO and IMO layers 604 and 608, and the CMO-based memory cell 606 exhibits a high resistance to current (i.e., is in a high-resistance state).

Figure 9:
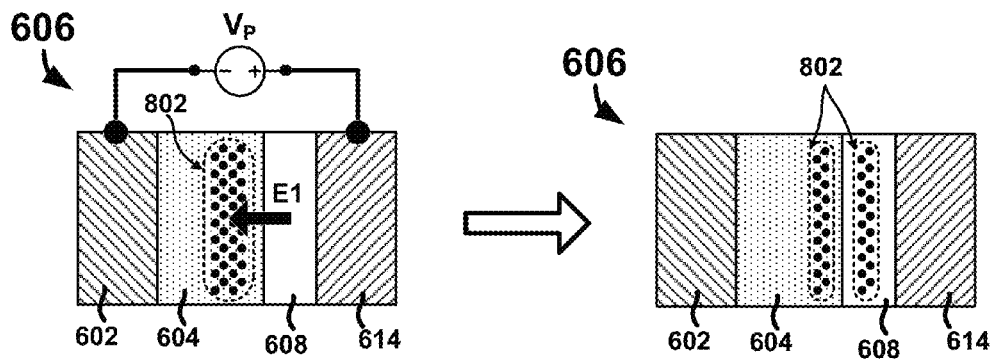
FIG. 9 depicts how a selected CMO-based memory element of the VCPA in FIG. 6 is programmed during a programming operation.
Figure 10:
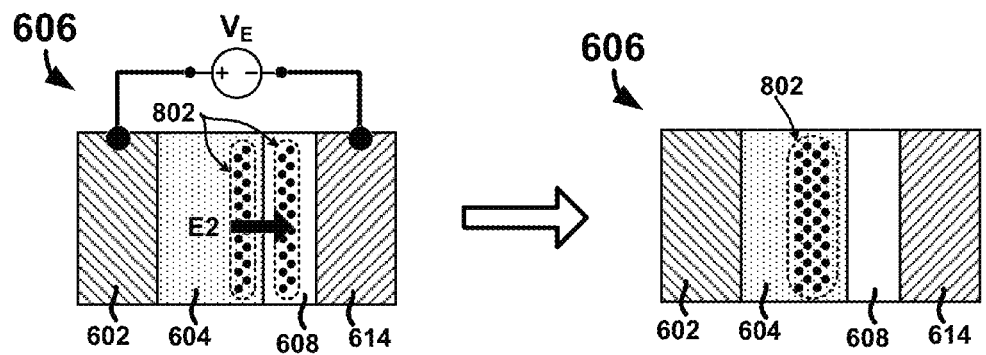
FIG. 10 depicts how a selected CMO-based memory element of the VCPA in FIG. 6 is erased during an erase operation.

FIGS. 9 and 10 are drawings depicting how the CMO-based memory cell 606 is programmed and erased. During a programming operation (FIG. 9), a program voltage signal $V_P$ comprising one or more programming pulses is applied across the electrodes 602 and 614 of the selected CMO-based memory cell 606. The programming pulse(s) generates an electric field E1 in the CMO and IMO layers 604 and 608, forcing a portion of the negatively-charged oxygen ions 802 in the CMO layer 604 to migrate into the IMO layer 608 and cause the CMO-based memory cell 606 to conform to a high-resistance, programmed state. (Note that when configured in the VCPA 600 in FIGS. 6-7, the program voltage signal $V_p$ is applied via the horizontal line 104 and the center conductor 602 of the vertical line 102 between which the memory cell 606 is disposed, similar to as described above in reference to FIG. 5B. Erase and read voltage signals $V_E$ and $V_R$ are also applied to a selected CMO-based memory cell 606 via the memory cell's respective center conductors 606 and horizontal lines 104 during erase and read operations (discussed below), similar to as shown in FIGS. 5C and 5A above.)

During the erase operation (FIG. 10), an erase voltage signal $V_E$ comprising one or more erase pulses having a polarity opposite that of the program pulses of the program voltage signal $V_P$ (note that the CMO-based memory cells 606 have bipolar switching characteristics) is applied across the electrodes 602 and 614 of the selected CMO-based memory cell 606. The erase pulses generates an electric field E2, opposite in polarity to that of E1, in the CMO and IMO layers 604 and 608, which forces a portion of the negatively-charged oxygen ions 802 to migrate back out of the IMO layer 608 into the CMO layer 604, resulting in the CMO-based memory cell 606 conforming to a low-resistance, erased state.

Once the CMO-based memory cell 606 has been programmed or erased to either resistive state, it maintains that resistive state, even in the absence of electrical power. No battery backup or other type of power source, such as a capacitor or the like, is necessary to retain the stored data. In other words, the CMO-based memory cell 606 is non-volatile. In addition to being non-volatile, the CMO-based memory cell 606 is re-writable, meaning that it can be programmed and erased over and over again.

The stored memory state of a selected CMO-based memory cell 606 is read by applying a read voltage $V_R$ across its electrodes 602 and 614, similar to as described in reference to FIG. 5A above. The read voltage $V_R$ has a magnitude sufficient to generate a measurable read current $I_R$ through the CMO-based memory cell 606 but not so high as to cause substantial migration (e.g., transport) of mobile oxygen ions between the CMO and IMO layers 604 and 608. The magnitude of the resulting read current $I_R$ is dependent upon the resistive state of the CMO-based memory cell 606 and a magnitude of the read voltage $V_R$. Consequently, when the CMO-based memory cell 606 is in a high-resistance state, the read current $I_R$ that results is lower than when the CMO-based memory cell 606 is in a low-resistance state. The read current $I_R$ is therefore indicative of the stored memory state (i.e., logic "0" or logic "1") of the CMO-based memory cell 606. When the CMO-based memory cell 606 is configured in the VCPA 600, the read current $I_R$ or other related signal is directed along the center conductor 602 of the vertical line 102 to a sense amplifier or other measuring circuit, which electrically determines the stored memory state of the selected memory cell 606 based on the received signal. It should be noted that the CMO-based memory 406 cells may be alternatively configured for MLC operation, in which the selected memory cell 606 would be configurable to more than two resistive states, each resistive state corresponding to one of several stored memory states, for example: a hard programmed state "00", a soft programmed state "01", a hard erased state "11" and a soft erase state "10."

Figure 11:
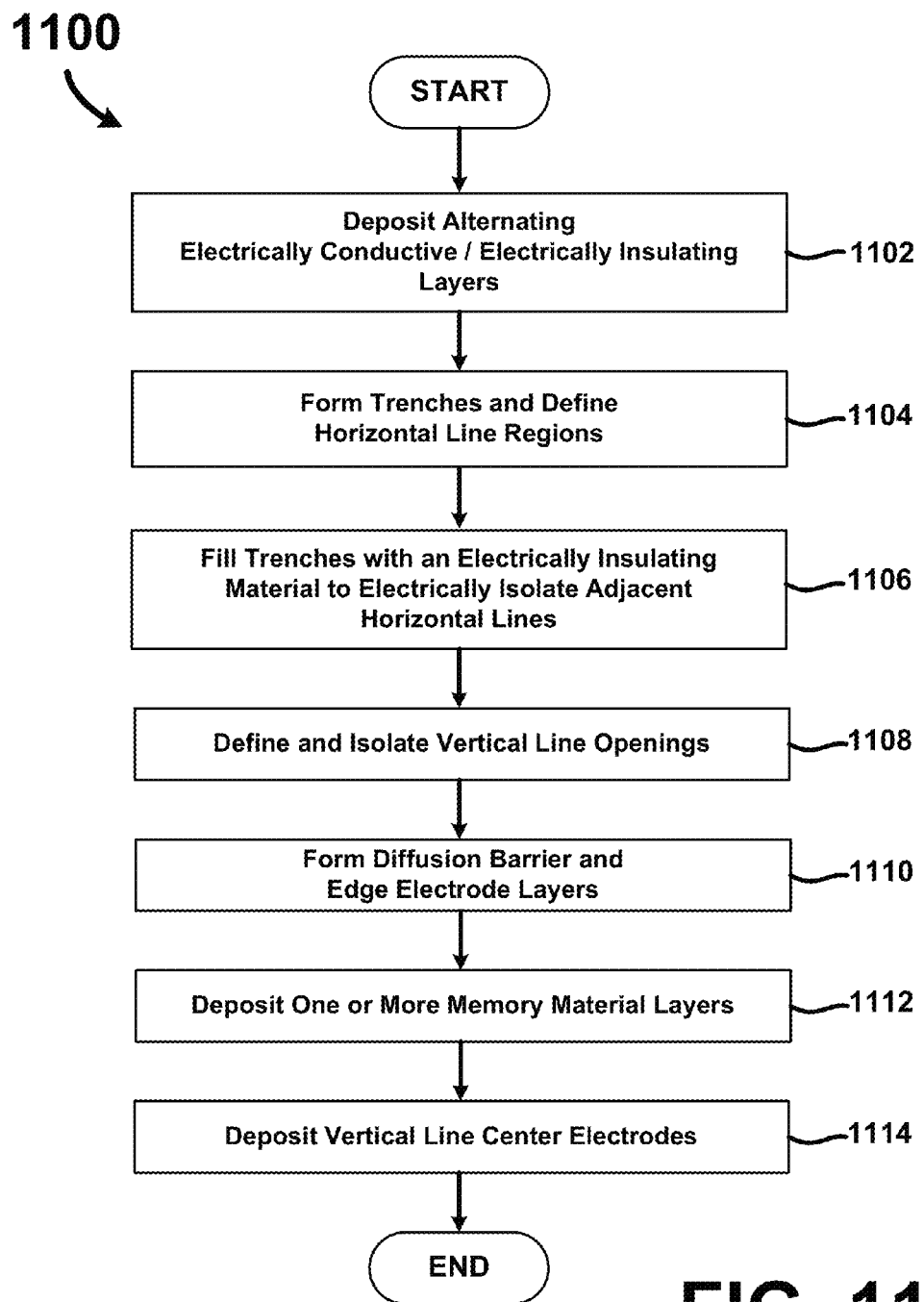
FIG. 11 is a flowchart depicting an exemplary fabrication method that may be used to fabricate a VCPA like or similar to the VCPA in FIGS. 6 and 7.

Turning now to FIG. 11, there is shown a flow chart of an exemplary back-end of the line (BEOL) fabrication method 1100, which may be used to fabricate a VCPA 1200, similar to the VCPA 600 shown and described above in reference to FIGS. 6 and 7. It should be emphasized that the fabrication method 1100 is but one of several ways in which the VCPA 600 can be manufactured. Only salient steps of the method 1100 are shown. Further, those of ordinary skill in the art will appreciate and understand that the various steps of the method 1100 need not necessarily be performed in the order shown and that some steps may not be needed or necessary in all circumstances. Finally, whereas the exemplary method 1100 is described in the context of fabricating a VCPA 600 having CMO-based memory cells 606, those of ordinary skill in the art will appreciate and understand that the method 1100 can be readily modified and adapted to manufacture VCPAs comprised of other types of memory cells, including, but not limited to, resistive change memory cells made from other types of materials besides CMO and IMO, chalcogenide-based memory cells, magnetorsesistive (i.e., ferromagnetic memory cells, ferroelectric memory cells, conductive bridge memory cells, memory cells that require a forming process, phase change memory cells, memristive memory cells (e.g., a memristor device), memory cells including multiple layers of memory material where one of those layers is a tunnel barrier layer, memory cells having a non-linear I-V characteristic, memory cells having a non-linear resistance characteristic, memory cells having a linear I-V characteristic, and memory cells having just a single or multiple memory film layers.

Figure 12A:
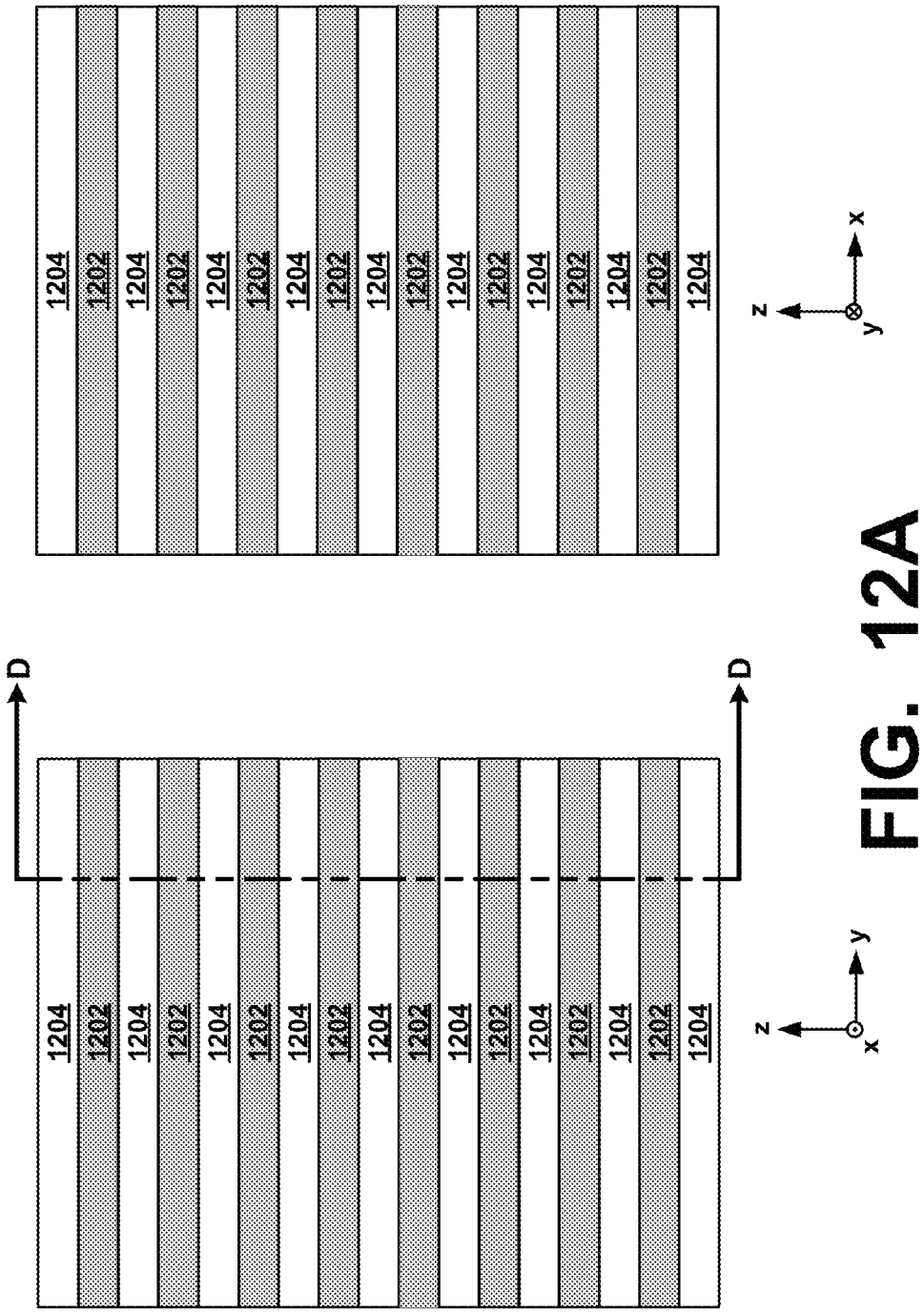
FIGS. 12A-H are sectional drawings of a VCPA, like or similar to the VCPA in FIGS. 6 and 7, at various stages in the fabrication method depicted in FIG. 11.

At the first stage 1102 of the method 1100 alternating blanket layers of electrically conducting and electrically insulating layers 1202 and 1204 (e.g., 50-100 nm in thickness each) are formed on a substrate (not shown). As discussed in further detail below, the substrate is a semiconductor substrate or a substrate having a semiconductor layer formed thereon within which some or all of the logic circuitry used to control and perform data operations on memory cells 606 of the VCPA 100 has been previously fabricated according to an FEOL semiconductor manufacturing process. The electrically conducting layers 1202 comprise a metal, such as tungsten W, aluminum Al, or tantalum Ta, for example, a metal alloy, or any other suitable electrically conducting material. The electrically conducting layers 1202 may be deposited using physical vapor deposition (PVD) (evaporation, sputtering or ablation of the film-forming material), chemical vapor deposition (CVD), in which gases, evaporating liquids, or chemically gasified solids are used as the source material, atomic layer deposition (ALD), a plating technique such as, for example, electroless plating, or any other suitable process. The electrically insulating layers 1204, which may comprise silicon oxide ($SiO_X$), silicon nitride ($SiN_X$), a combination of $SiO_X$ and $SiN_X$, a silicate glass (doped or un-doped), or other dielectric material such as a low dielectric constant (i.e., low-k) material, are deposited using CVD, for example from a TEOS (tetraethylorthosilicate) source, or by vapor phase epitaxy (VPE). The partially completed VCPA structure following formation of the alternating conducting and insulating layers 1202 and 1204 is shown in FIG. 12A, which includes both y-z plane and x-z plane (through cutting plane D-D of the y-z plane) sectional views of the partially completed VCPA structure.

Figure 12B:
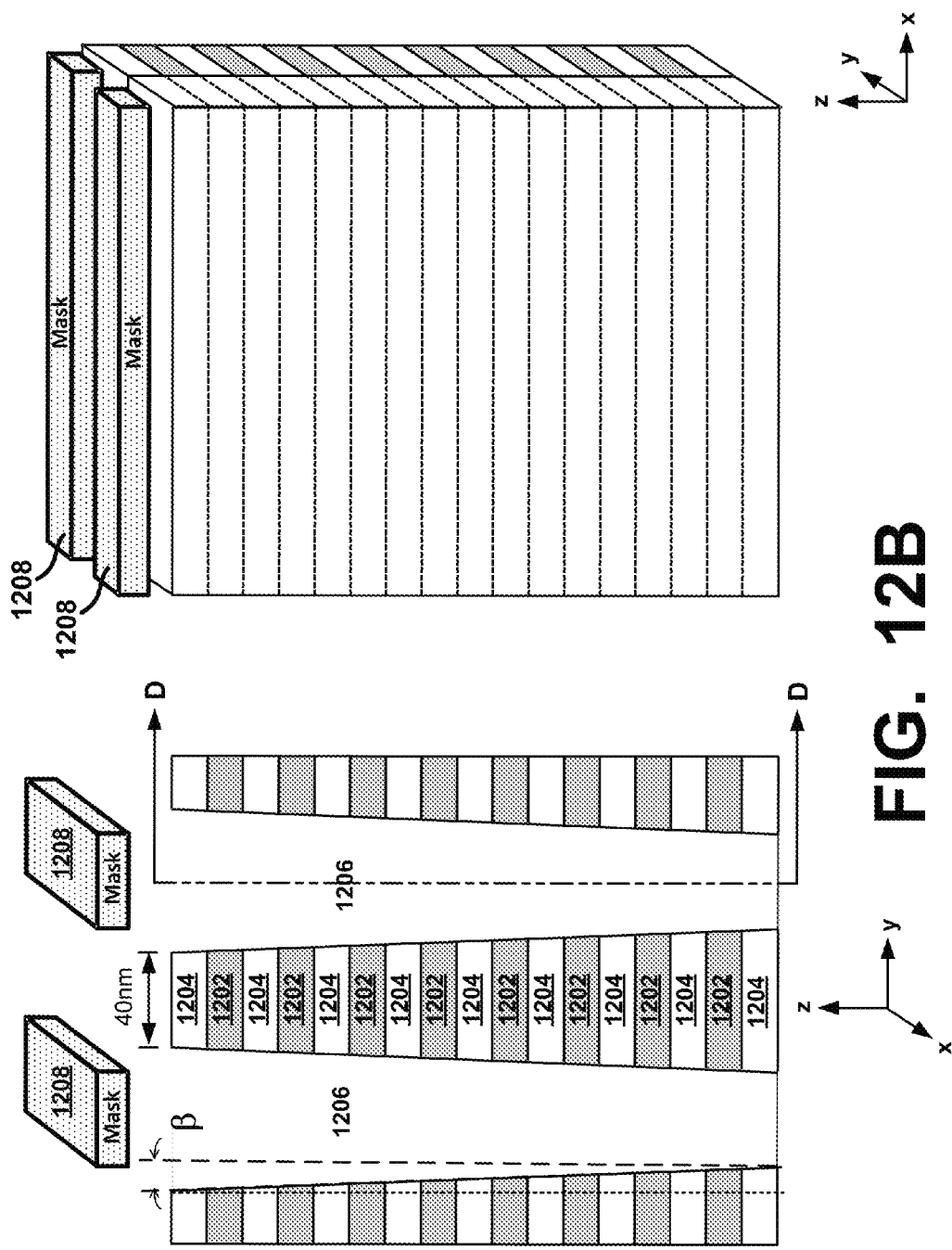

Next, at stage 1104, trenches 1206 extending in the x-direction are formed through the conducting and insulating layers 1202 and 1204, to define the horizontal lines 104 of the VCPA 1200. The trenches 1206 may be formed in various ways. In one embodiment of the invention, illustrated in FIG. 12B, trench opening patterns are first lithographically defined according to a first mask 1208 and then anisotropically etched using a dry etch process, such as a plasma etch (e.g., a reactive ion etch (RIE)). The partially completed VCPA structure following stage 1104 is shown in FIG. 12B.

Figure 12C:
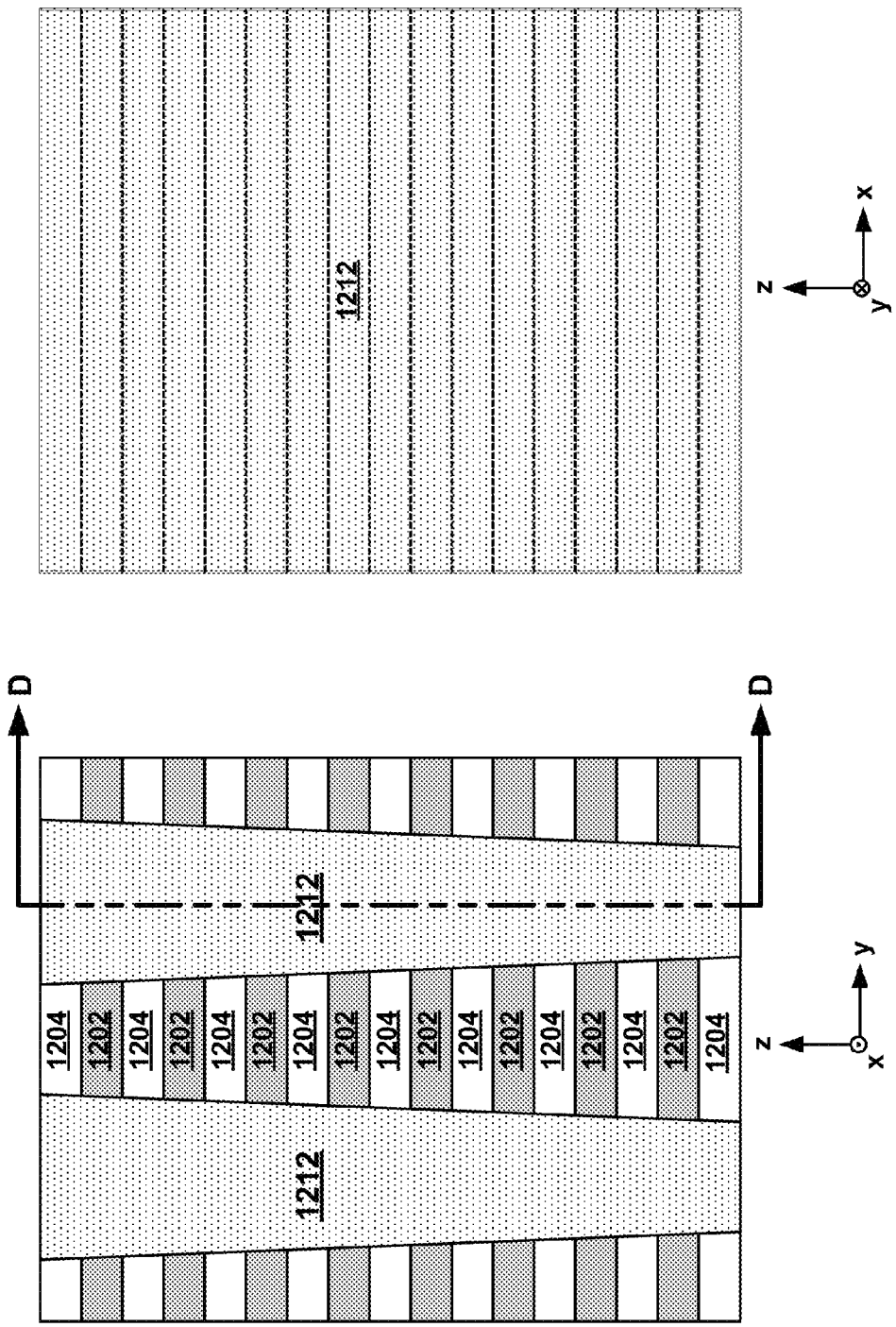

At stage 1106, the trenches 1206 are filled with a second insulating material 1212 having a high etch selectivity to materials used for the conducting and insulating layers 1202 and 1204, using ALD, for example. Exemplary materials that can be used for the second insulating material 1212 include $SiO_X$, $SiN_X$, or other high-etch-selectivity material. The partially completed VCPA structure following stage 1106 is shown in FIG. 12C.

After the trenches 1206 have been filled with the second insulating material 1212, at stage 1108 vertical line openings (i.e., "holes") 1210 defining the outer boundaries of the yet-to-be-manufactured vertical lines 102 of the VCPA 1200 are patterned and etched in a second lithography step using a second mask 1214 having features perpendicular to those of the first mask 1208. The second etch is a selective etch that preferentially etches the second insulating material 1212 according to the pattern produced from the second mask 1214 but does not etch (or does not substantially etch) other materials like the materials used for the conducting and insulating layers 1202 and 1204.

Figure 12D:
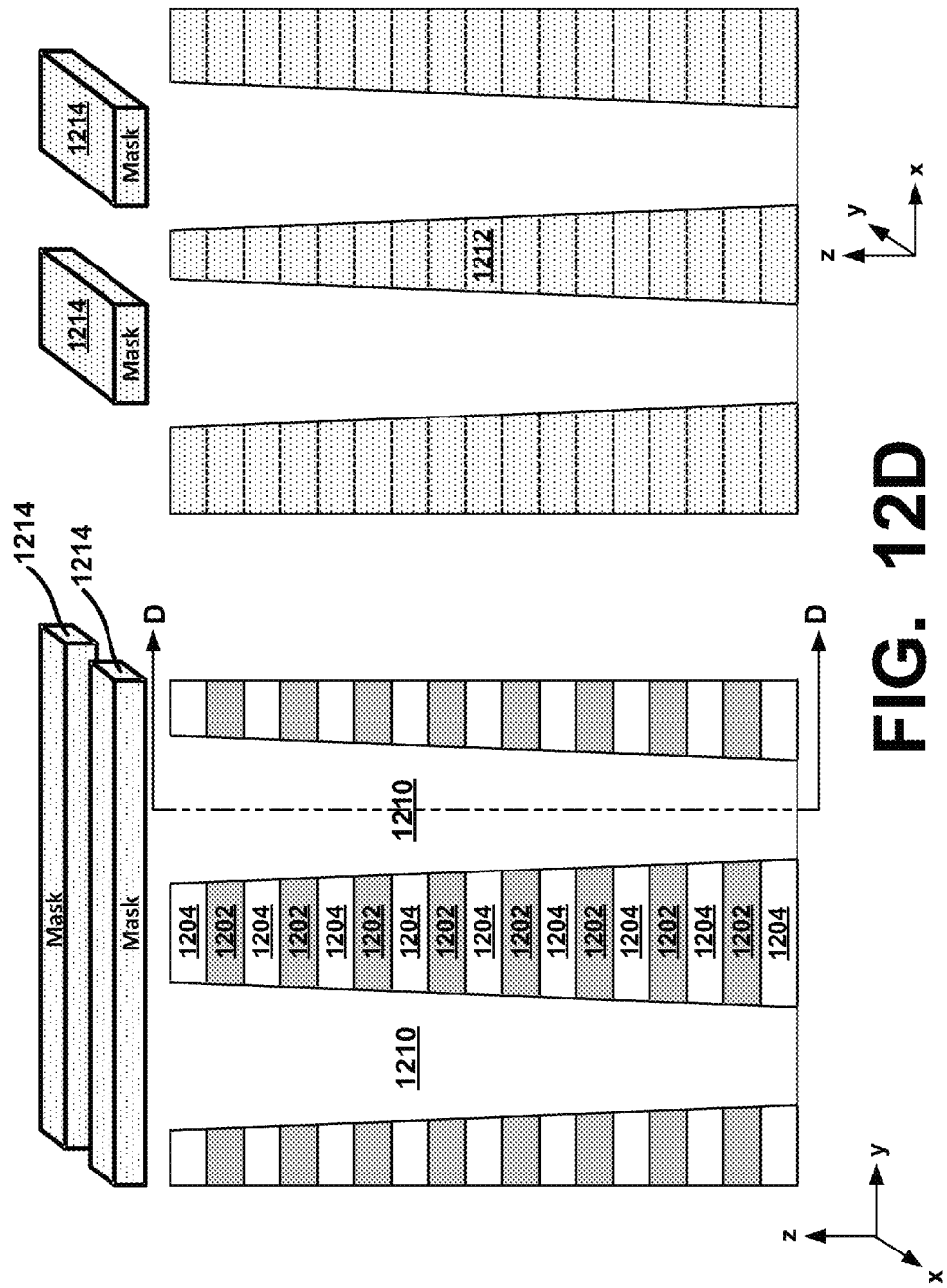

The partially completed VCPA structure following stage 1108 is shown in FIG. 12D. It should be noted that the vertical line openings 1210 are not perfectly vertical. This is due to limits on the ability of currently available etching technologies to form perfectly vertical trenches. Nevertheless, the vertical line openings 1210 include a high aspect ratio. In some embodiments of the invention, for example, the aspect ratio is between about 20:1 and 80:1, depending on the number of electrically conductive and electrically insulating materials 1202 and 1204. In the exemplary embodiment shown and described here, the vertical line openings 1210 have a recessive slope 13 (see FIG. 12E) of approximately 0.7 degrees, which provides an aspect ratio of approximately 80:1 (i.e., 1/sin(0.7):1≅80:1)). It should be emphasized, however, depending on the design and/or processing capabilities, the aspect ratio of the vertical line openings can be less than 20:1 or greater than 80:1. Future advances in microelectronics processing technology may provide for future processes and/or materials that produce high aspect ratio openings (e.g., trenches) having vertical or substantially vertical sidewall surfaces. Therefore, in some implementations the openings/trenches described herein may include high aspect ratio structures having vertical or substantially vertical sidewall surfaces.

Figure 12E:
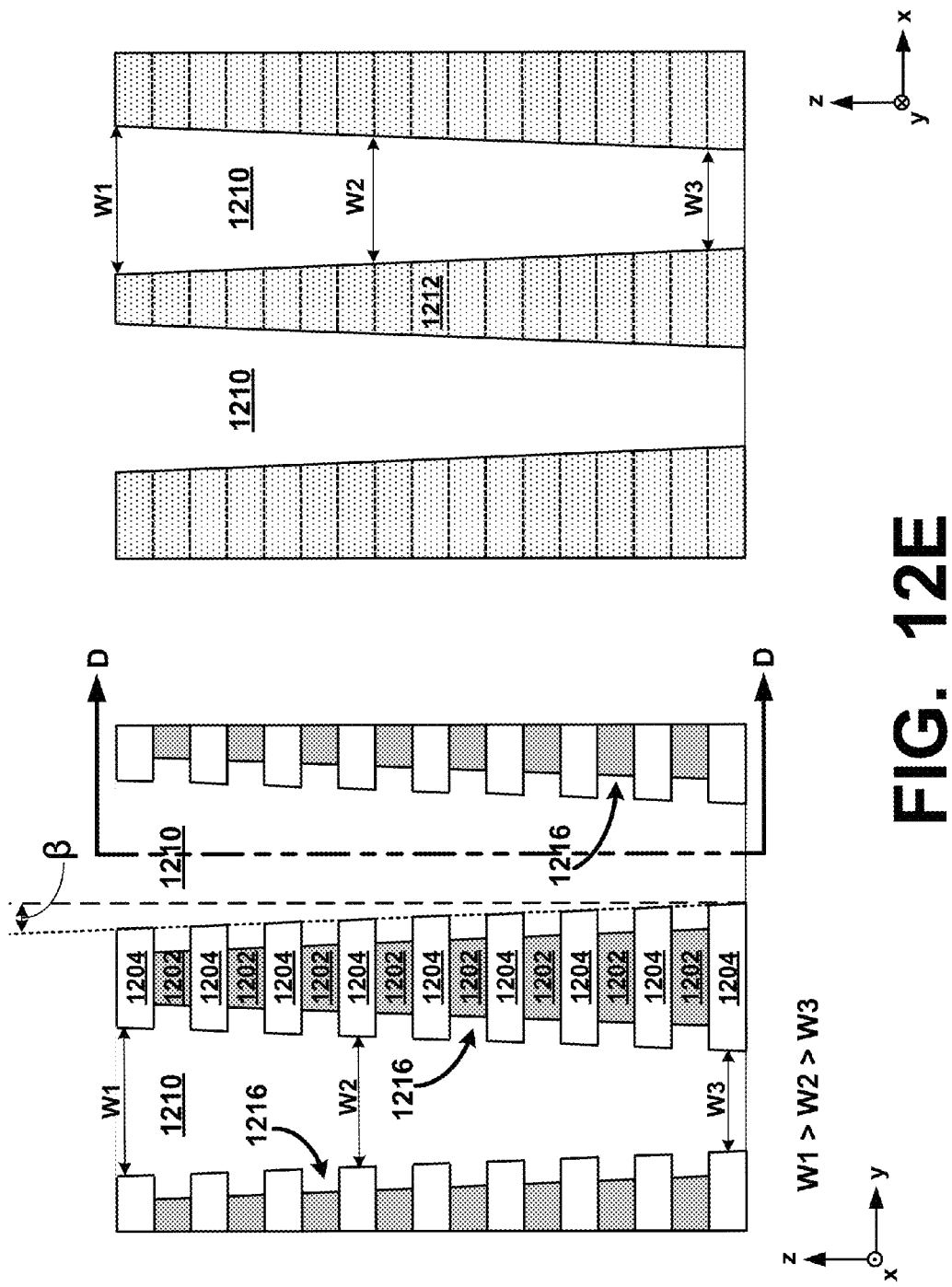
Figure 12F:
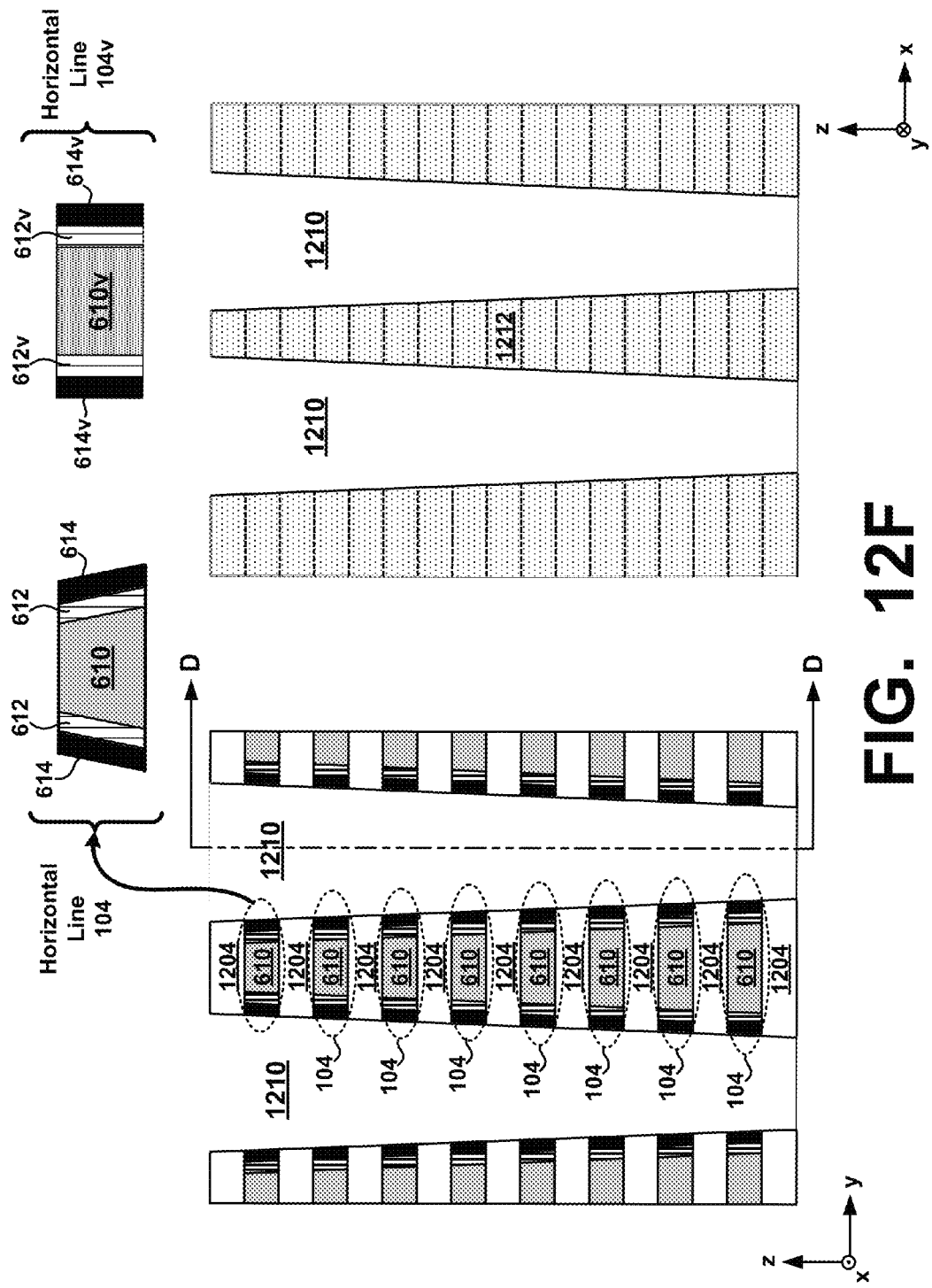

After the vertical lines openings 1210 have been formed, at stage 1110 diffusion barrier layers 612 and edge electrode layers 614 (see FIGS. 6 and 7) along the horizontal lines 104 are formed (e.g., using ALD and/or a plating process). To form these layers 612 and 614, recesses 1216 are first etched in exposed areas of the electrically conducting layers 1202, as shown in FIG. 12E, using a selective etch that preferentially removes only portions of the electrically conducting layers 1202 and not the electrically insulating layers 1204. Then, the diffusion barrier layers 612, which may comprise cobalt-tungsten-phosphorus (CoWP) or Nickel-phosphorous (NiP), for example, and edge electrode layers 614, which may comprise a noble metal or noble metal alloy such as platinum (Pt) or ruthenium (Ru), for example, are formed in the recesses 1216 using selective deposition or plating processes that promotes adhesion to conducting layers 1202 but not to the insulating layers 1204. (At this stage in the method 1100, a non-ohmic device (NOD), such as for example a metal-insulator-metal (MIM) structure or diode(s), may also be formed in each of the recesses 1216. If used, the NODs can serve as a selection device operative to suppress undesirable leakage currents in un-selected or half-selected memory elements). The NOD may include a non-linear I-V characteristic that is separate and apart from any linear or non-linear I-V or non-linear resistance characteristic of the memory cells or memory elements described herein. Completion of stage 1110 results in strips of diffusion barrier and edge electrode layers 612 and 614 running along the x-z surface edges of the horizontal lines 104, as can be seen in FIG. 12F. The strips of diffusion barrier and edge electrode layers 612 and 614 can also be seen in FIGS. 6 and 7 above.

As alluded to above, although the vertical line openings 1210 have a high aspect ratio, realizing very high aspect ratios can be limited by the capability of available etching technologies, especially in the formation of deep trenches and openings. As illustrated in the FIG. 12E, the vertical line openings 1210 narrow in width from top to bottom as denoted by widths W1, W2, and W3, such that at the top width W1 is greater than width W2 midway in the opening which is turn is greater than width W3 at the bottom of the opening (i.e., W1>W2>W3). Because the openings 1210 are not perfectly vertical, the horizontal lines 104, including conductive lines 610, diffusion barrier 612 and edge electrodes 614, have sloped profiles. Advances in processing technologies may eventually allow the formation of deep trenches 1206 and line openings 1210 having much higher or essentially infinite aspect ratios, however, resulting in horizontal lines 104v having vertical features 610v, 612v, and 614v as shown in the right-most drawing in FIG. 12F. For the purpose of this disclosure, therefore, the term "vertical line opening" especially as that term is used in the claims, should be construed as encompassing within its meaning not only truly vertical line openings but line openings that, though not perfectly vertical, have a high aspect ratio (i.e., are substantially vertical).

Figure 12G:
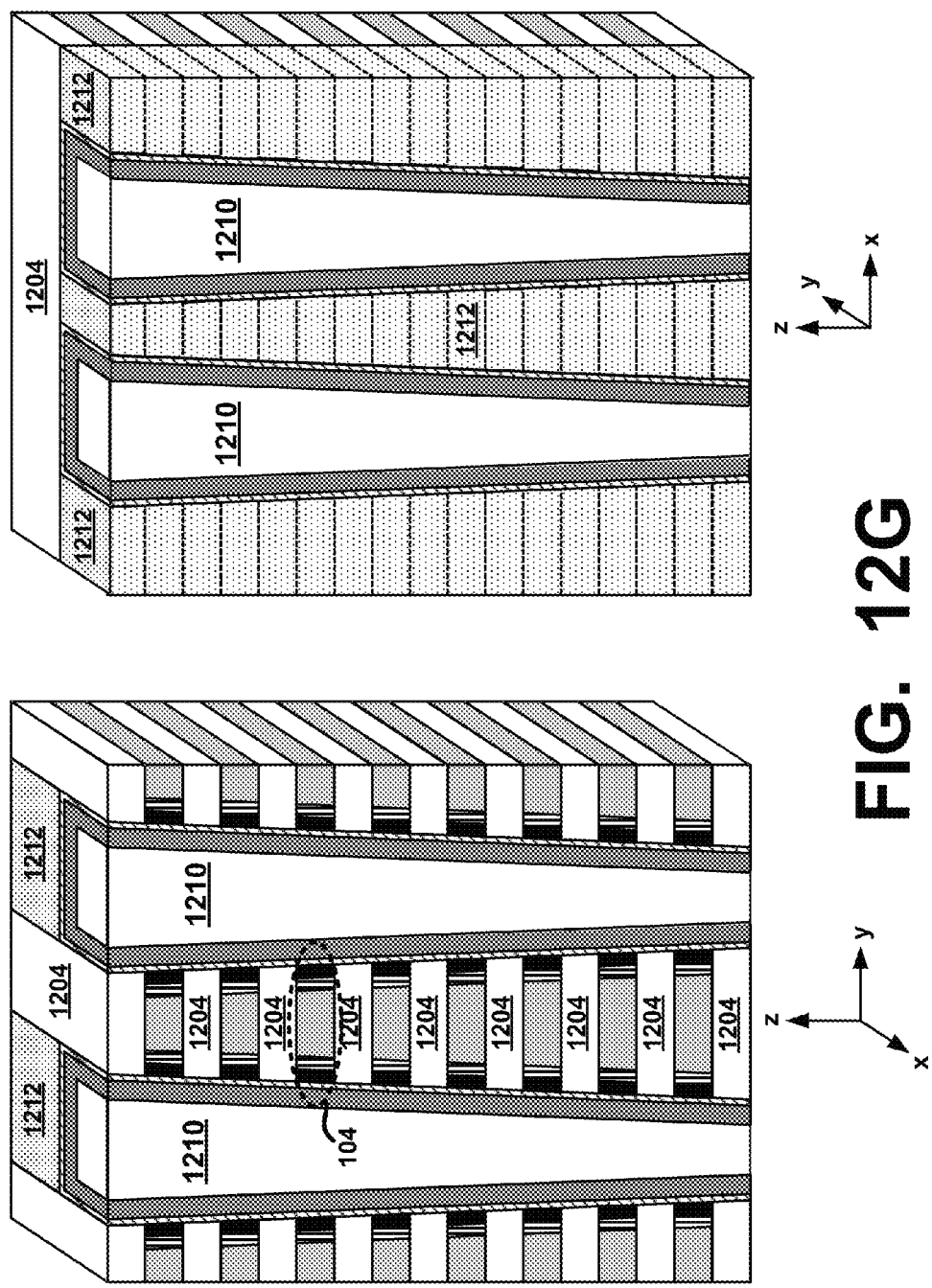

After the diffusion barrier layers 612 and edge electrode layers 614 have been formed, at stage 1112 one or more memory film layers, for example, including but not limited to one or more CMO layer(s) 602 and one or more IMO layer(s) 604 of the CMO-based memory cell 606, are formed on the inner sidewalls of the vertical line openings 1210. The deposition technique that is used is preferably a self-limiting conformal deposition technique such as, for example ALD and/or plasma enhanced ALD (PEALD). ALD allows formation of very thin films that can be controlled to within about 1 Å. In one embodiment of the invention, ALD is used to deposit one or more thin-film layers of IMO and CMO having thickness ranging between about 5-50 Å and about 15-300 Å, respectively. Examples of IMO materials that may be used include, but are not limited to: YSZ, YOx, ErOx, GdOx, LaAlOx, HfOx, TaOx, ZrOx and Al$_2$Ox. Examples of CMO materials that may be used include, but are not limited to PCMO, LNO, SRO, LSCrO, LCMO, LSCMO, LSMO, LSCoO, and LSFeO. After the memory film layer(s) has(have) been deposited, chemical mechanical polishing (CMP) may then be employed to remove residual memory film material that was undesirably deposited on the top surface of the structure. The partially completed VCPA structure following stage 1112 is shown in FIG. 12G.

Figure 12H:
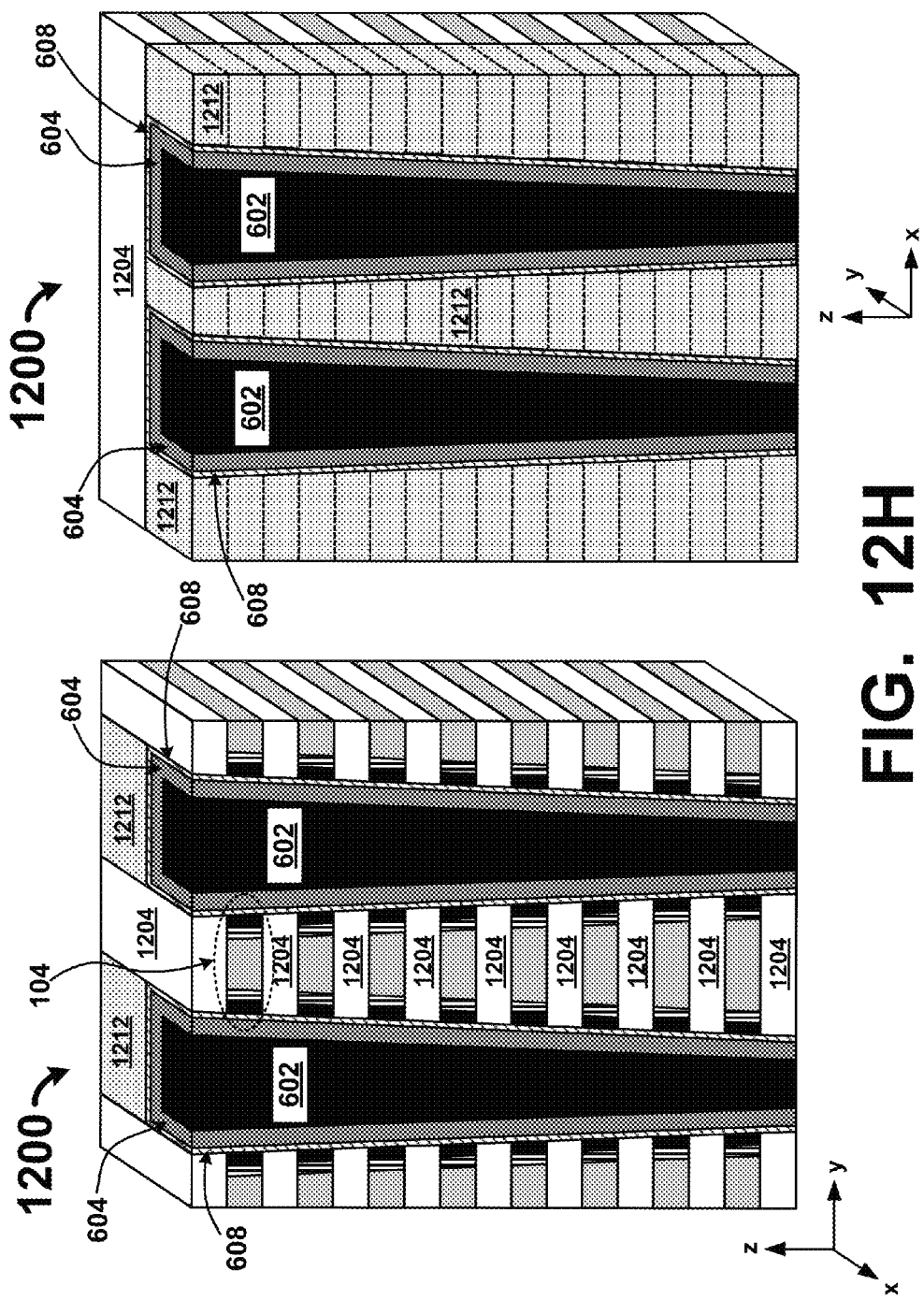

At stage 1114, a metal, for example a noble metal such as Pt or Ru, is deposited or plated on the sidewalls of the memory-film-lined vertical line openings 1210, using ALD or a plating process. Then, a conductive barrier (e.g. Ru) and a bulk metal (e.g., copper (Cu)) are filled in the openings 1210 to complete formation of the center conductors 602 of the vertical lines 102. The completed VCPA 1200 following completion of stage 1114 is shown in FIG. 12H.

Figure 13:
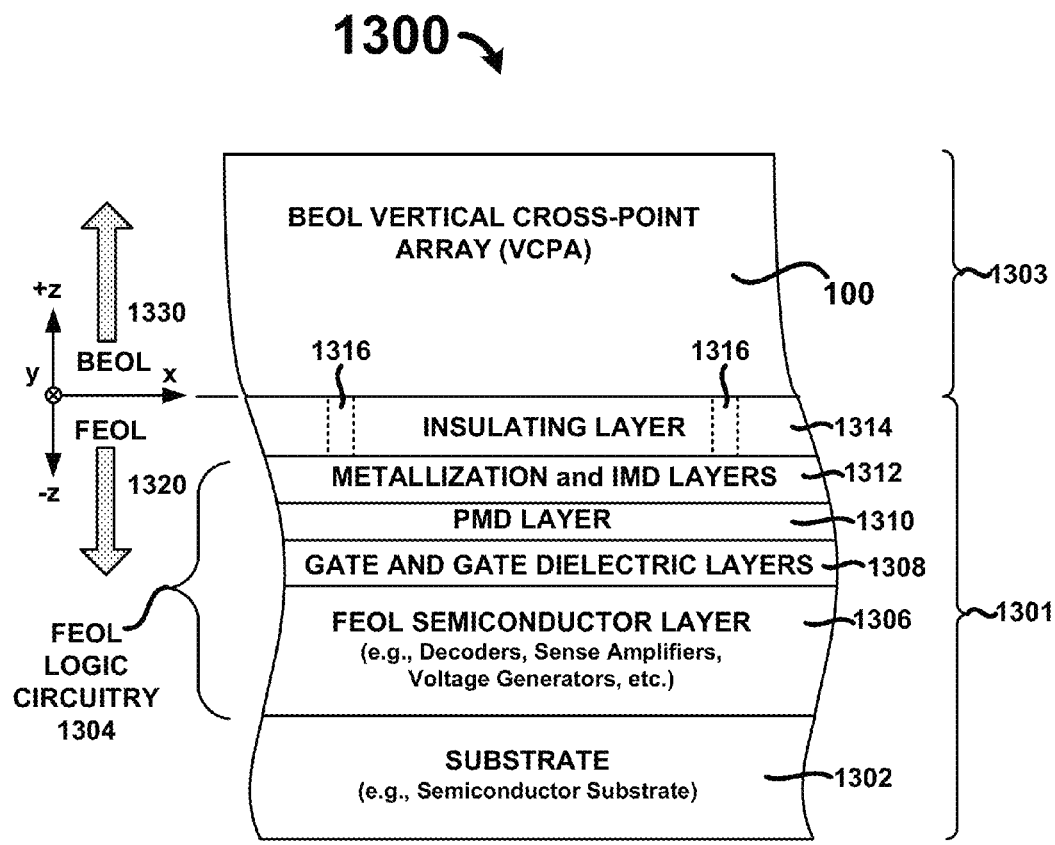
FIG. 13 is a sectional view of a completed memory structure that includes a VCPA, similar to the VCPA depicted in FIGS. 1-4, and a front-end of the line (FEOL) portion upon which the VCPA is formed.

According to one aspect of the invention, the fabrication method 1100 comprises a back-end of the line (BEOL) manufacturing process that is performed after a front-end of the line (FEOL) semiconductor manufacturing process, in which logic circuitry (e.g., address decoders, data buffers, registers, voltage drivers, memory controller, sense amplifiers, voltage generators, etc.) used to exercise and control the VCPA, is performed. FIG. 13 depicts a cross-section of a memory structure 1300 that includes a VCPA 100 similar to that depicted above in FIGS. 1-4 above, in accordance with this embodiment of the invention. Prior to BEOL processing (indicated by the upward-pointing large arrow 1330), FEOL processing (indicated by the downward-pointing large arrow 1320) is performed to form the various layers of FEOL portion 1301. In one embodiment of the invention, FEOL processing 1320 comprises a complementary metal-oxide-semiconductor (CMOS) semiconductor manufacturing process that includes the following salient steps: (1) implanting doped regions of active devices (e.g., transistors diodes) and other circuit elements of logic circuitry 1304 in a semiconductor substrate or a semiconductor layer 1306 formed over a substrate 1302; (2) growing gate and gate dielectric layers 1308 over the semiconductor layer 1306; (3) patterning and etching the gate and gate dielectric layers 1308 to form gates and gate dielectrics for the active devices; (4) depositing a pre-metal dielectric (PMD) layer 1310 over the gate and gate dielectric layers 1308; (5) depositing, patterning and etching metallization and intra-metal dielectric (IMD) layers 1312 over the PMD layer 1310; (6) forming vias to electrically connect active devices and other circuit elements in the underlying layers; and (7) forming a top insulating layer 1314 over the metallization and IMD layers 1312. Further details of CMOS fabrication processes that may be used or readily adapted to form the FEOL portion 1301 of the memory structure 1300 may be found in R. Jacob Baker, "CMOS Circuit Design, Layout and Simulation," Revised Second Edition, IEEE Press, John Wiley & Sons, 2008, which is hereby incorporated by reference.

After the FEOL portion 1301 has been fabricated, the VCPA 100 is manufactured directly on top of the FEOL portion 1301 in BEOL processing 1330 BEOL processing 1330 is identical or similar to the VCPA fabrication method 1100 described above in connection FIGS. 11 and 12A-H. By growing the VCPA 100 directly on top of the FEOL portion 1301, a unitary integrated circuit comprising monolithically integrated and inseparable FEOL and BEOL portions 1301 and 1303 is formed.

One major benefit of forming the VCPA 100 in a separate BEOL process is that it affords the ability to form all, substantially all, or a significant portion of the logic circuitry 1304 beneath the VCPA 100 in the FEOL portion 1301. This reduces the overall footprint of the memory structure 1300 (e.g., reduces die size), thereby allowing a large number of memory structures 1300 to be manufactured across the surface of the substrate 1302 (e.g., allows for more die per wafer).

During BEOL processing 1330 (or, alternatively, beforehand during FEOL processing 1320), conductive vias 1316 are patterned and etched beneath and/or along the periphery of the VCPA 100 and then filled with a conductive material (e.g., metal) to electrically couple the horizontal lines 104 and center conductors 202 of the vertical lines 102 of the VCPA 100 to metal interconnects in the FEOL metallization and IMD layers 1312. Additional conductive vias, previously formed through the PMD and gate and gate dielectric layers 1310 and 1308 during FEOL processing 1320 (not shown in FIG. 13; see step (6) in the summary of the salient FEOL processing steps describe above), serve to complete the electrical interconnection of the VCPA 100 to transistors and other devices in the logic circuitry 1304 of the FEOL portion 1301.

According to one embodiment of the invention illustrated in FIGS. 14A and 14B, a plurality of memory die 1404 is formed simultaneously across the surface of the substrate (i.e., wafer) 1302. Each memory die 1404 includes one or more memory structures like or similar to the memory structure 1300 in FIG. 13. FIG. 14A shows the wafer 1302 just after FEOL processing 1320. At this stage in the process, the wafer 1302 includes a plurality of partially completed memory die 1402, each containing only the FEOL portion 1301. The FEOL-processed wafer 1302 is optionally subjected to FEOL testing 1408 to verify functionality of the logic circuitry 1304 in the partially completed memory die 1402. Partially completed memory die 1402 that fail FEOL testing 1408 are identified, e.g., by visual marking and/or electronically in a file, database, email, etc., and communicated to the BEOL fabricator and/or fabrication facility. Partially completed memory die 1402 determined to comply with a specific performance grade (e.g., frequency of operation) may also be identified, sorted and/or communicated to the BEOL fabricator and/or fabrication facility.

Following FEOL testing 1408, the wafer lot containing wafer 1302 is optionally transported 1410 to the BEOL fabricator and/or fabrication facility for subsequent BEOL processing. In some applications both FEOL and BEOL processing 1320 and 1330 are performed by the same fabricator or are performed at the same fabrication facility, in which case transport 1410 may not be necessary.

During BEOL processing 1330, the VCPAs 100 are fabricated directly on top of the upper surface 1405s of the previously fabricated and partially completed memory die 1402. It should be emphasized that the VCPAs 100 are not glued, soldered, wafer bonded, or manually attached to the partially completed memory die 1402. Rather, they are grown directly on the upper surfaces 1405s of the partially completed memory die 1402, according to a BEOL fabrication process like or similar to the BEOL fabrication process 1100 shown and described in reference to FIGS. 11 and 12A-H above.

FIG. 14B shows the wafer 1302 just after BEOL processing 1330. The wafer 1302 includes a plurality of completed memory die 1404 formed across the wafer 1302. The wafer 1302 and completed memory die 1404 are then subjected to BEOL testing 1412 to verify functionality, measure electrical characteristics, determine yield, etc. After BEOL testing 1412, the memory die 1404 are singulated 1414 (i.e., cut or sawed) into individual memory chips 1406. Each singulated memory chip 1406 that passed both FEOL and BEOL testing 1408 and 1412 is then optionally packaged 1416 in an integrated circuit (IC) package, thereby producing a packaged memory chip product 1418. Finally, the packaged memory chip products 1418 are subjected to final testing 1420 to verify functionality.

The VCPA 100 and other VCPAs described herein are designed to have gigabit, terabit and even higher memory capacities. To simplify wire routing and reduce the number of conductive vias 1316 needed to electrically couple the VCPA 100 to the underlying logic circuitry 1304 in the FEOL portion 1301, in one embodiment of the invention the vertical lines 102, specifically, the center conductors 202 of the vertical lines 102, which may be referred to as local bitlines or "LBLs") are arranged so that they share a reduced number of conductive global bitlines (or "GBLs"). Each LBL is then selected through one of the GBLs using decoders configured in the FEOL logic circuitry 1304—either directly beneath the VCPA 100 or around its periphery.

Figure 15:
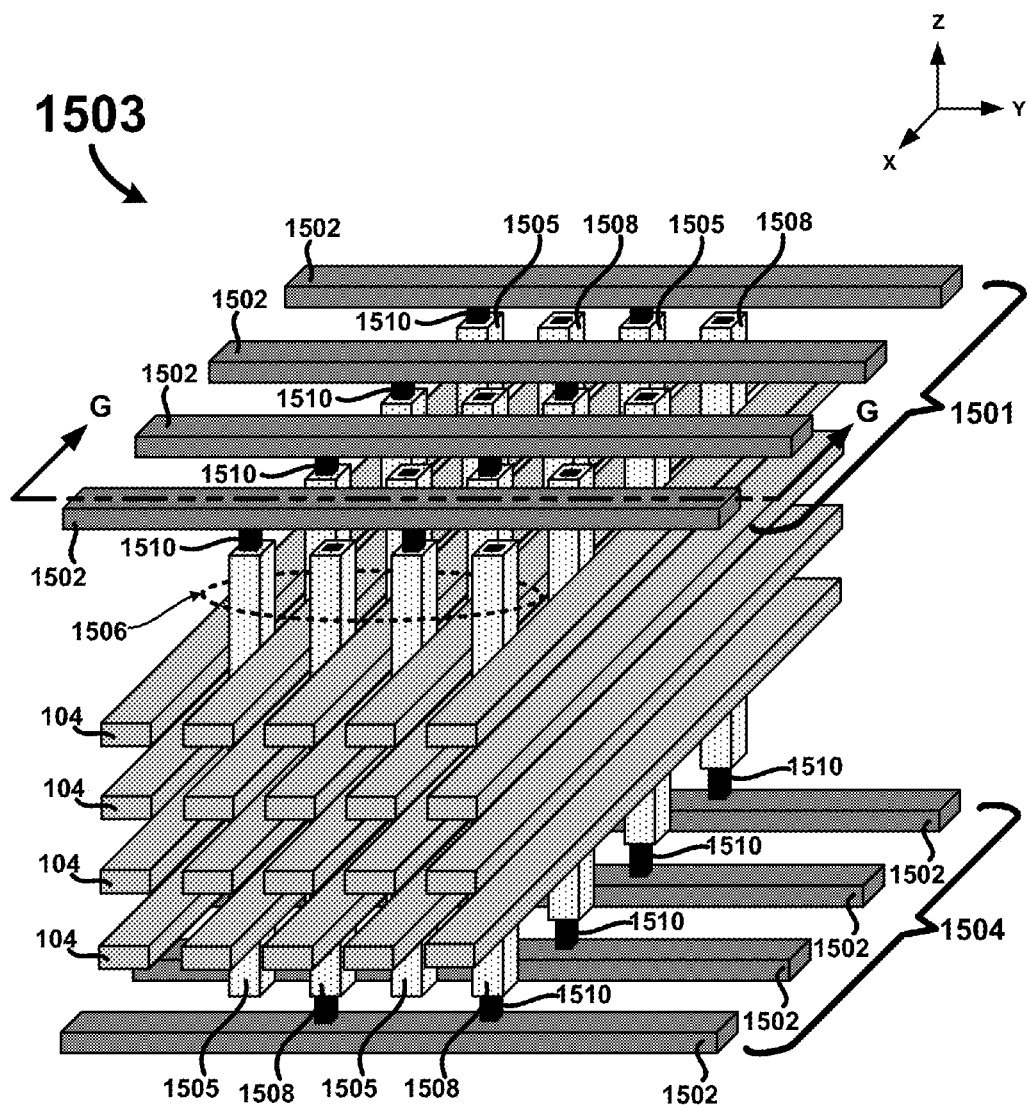
FIG. 15 depicts a BEOL portion of a memory structure containing a VCPA similar to the VCPA in FIGS. 1-3, highlighting how the center conductors (i.e., local bitlines) of vertical lines of the VCPA are coupled to horizontal global bitlines, according to one embodiment of the present invention.
Figure 16A:
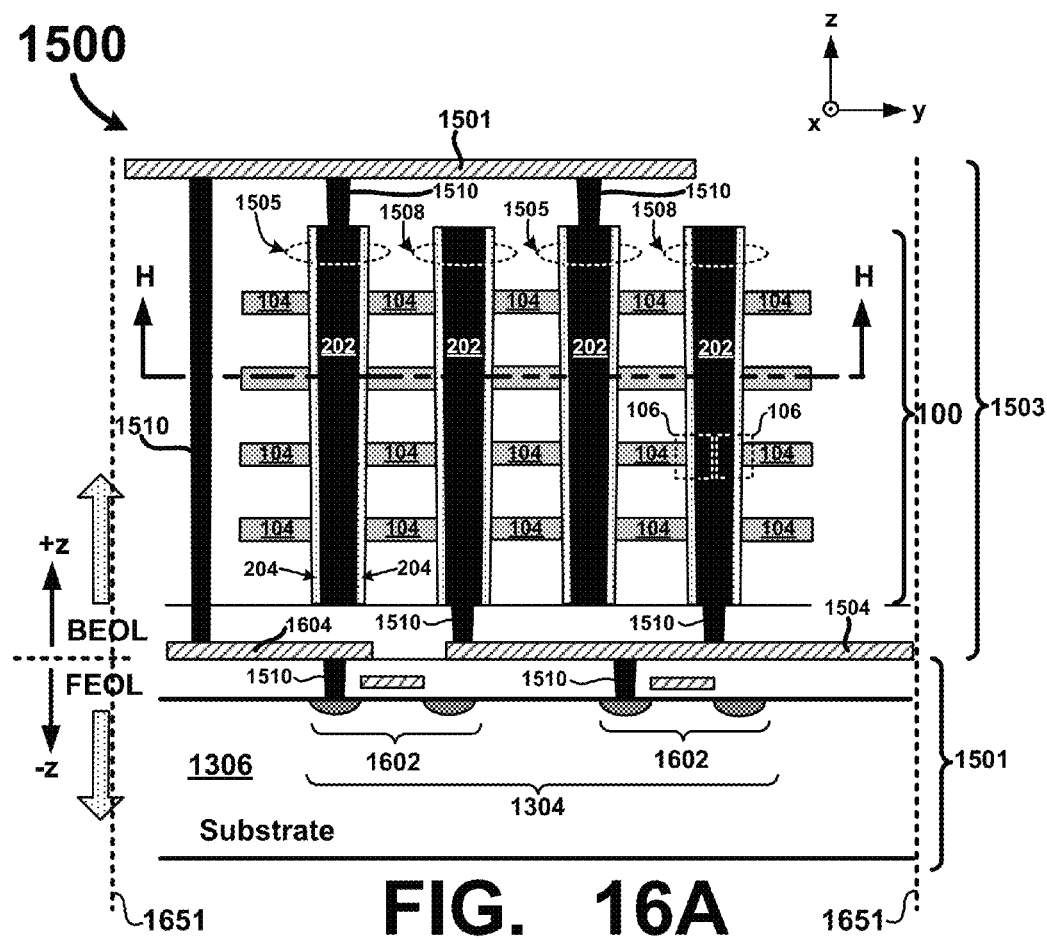
FIG. 16A is a sectional view of a memory structure containing the BEOL portion in FIG. 15 (through cutting plane G-G of the BEOL portion) and an FEOL portion containing FEOL select transistors and other logic circuitry used to electrically access the VCPA of the BEOL portion for data operations.
Figure 17:
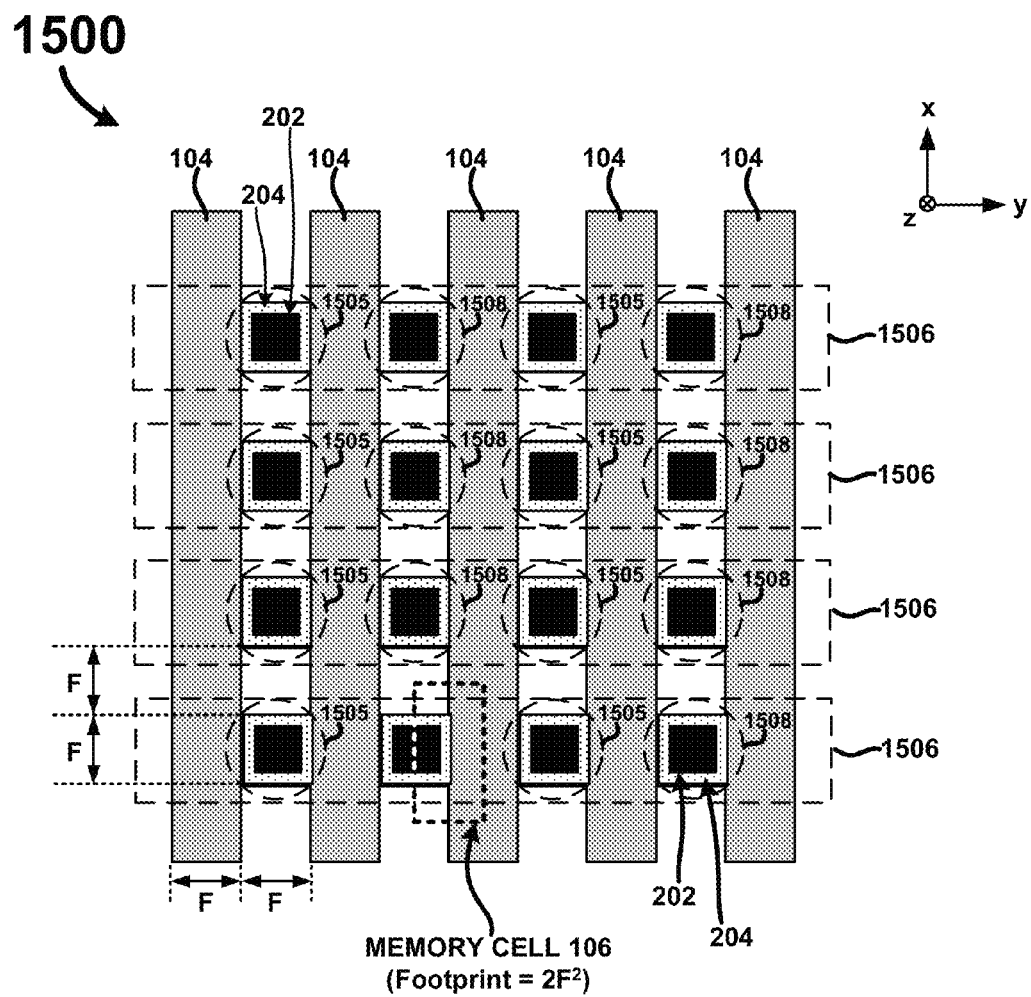
FIG. 17 is a sectional view of the BEOL memory structure in FIG. 16 through cutting plane H-H.
Figure 18:
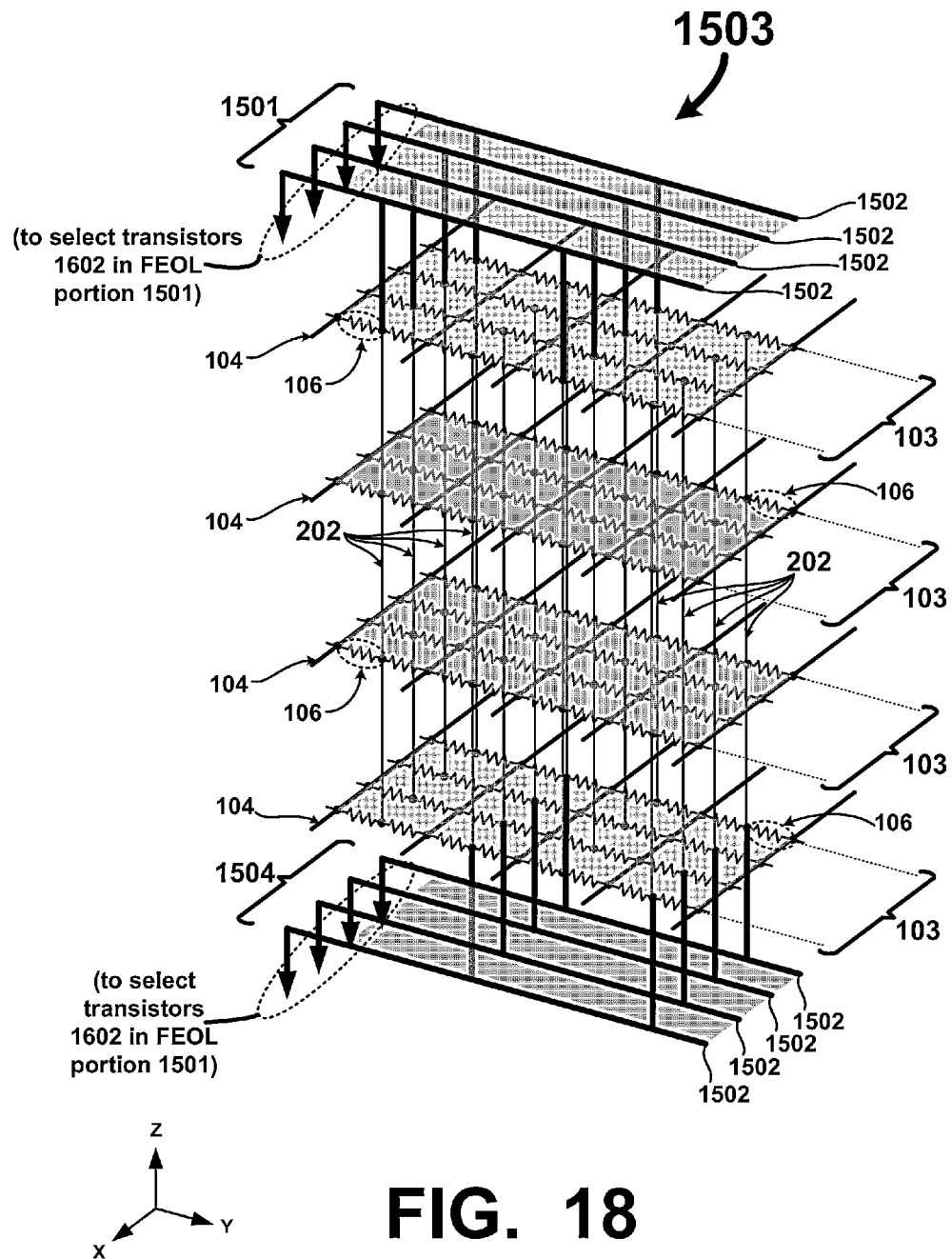
FIG. 18 is a schematic, perspective view of the BEOL portion of the memory structure in FIG. 16.

FIG. 15 is perspective drawing of the BEOL portion 1503 of a memory structure 1500, depicting how vertical lines 1505 and 1508 of the VCPA 100 are coupled to conductive GBLs 1502, according to one embodiment of the invention. FIG. 16A is a sectional view of the memory structure 1500 itself through cutting plane G-G in FIG. 15. As shown, the center conductors 202 (i.e., the LBLs) of the vertical lines 1505 and 1508 are coupled to GBLs 1502 in either an upper GBL layer 1501 or a lower GBL layer 1504, by way of conductive vias 1510. More specifically and as is further illustrated in FIG. 17, which is sectional view of the memory structure 1500 through cutting plane H—H in FIG. 16A, and FIG. 18, which is a schematic perspective view of the BEOL portion 1503 of the memory structure 1500, the center conductors 202 of the odd vertical lines 1505 (odd LBLs) in each left-to-right rank 1506 of vertical lines (i.e., each column 1506 of vertical lines) are connected to a GBL 1502 in the upper GBL layer 1501 and the center conductors 202 of the even vertical lines 1508 (even LBLs) in the same column 1506 of vertical lines are connected to a GBL 1502 in the lower GBL layer 1504. The vertical line connections to the GBLs 1502 in the upper and lower GBL layers 1501 and 1502 could be reversed, i.e., so that the center conductors 202 of the odd vertical lines 1505 in each column 1506 are connected to GBLs 1502 in the lower GBL layer 1504 and the center conductors 202 of the even vertical lines 1508 are connected to GBLs 1502 in the upper GBL layer 1501. In general, the center conductors 202 of any non-adjacent vertical lines in a given column 1506 of vertical lines 1508 may be connected to a common GBL in either one of the upper or lower GBL layers 1501 and 1504 with other non-adjacent vertical lines in the given column connected to a common GBL 1502 in the other GBL layer. In other words, an even/odd alternation is not required. All that is necessary is that no two adjacent vertical lines in a given column 1506 of vertical lines share the same GBL.

As shown in FIG. 16A, GBLs 1502 of both the upper and lower GBL layers 1501 and 1504 are electrically coupled to FEOL LBL select transistors 1602 (i.e., metal oxide field effect transistors (MOSFETs)) fabricated in the underlying FEOL portion 1501 of the memory structure 1500, by way of conductive vias 1510 and metal interconnects 1604. The select transistors 1602 operate to electrically couple or decouple the center conductors 202 of the vertical lines 1505 and 1508 of associated memory cells 106 to decoding or sense circuits in the FEOL logic circuitry 1304, depending on which memory cells 106 in the VCPA 100 are selected during data operations. Here, dashed lines 1651 demarcate a footprint boundary of the BEOL VCPA in relation to the FEOL substrate layer 1306. As will be described in greater detail below in regards to FIG. 16B, the select transistors 1602 are positioned beneath the VCPA within the boundaries of the footprint 1651. The GBLs 1502 of the upper GBL layer 1501 are formed during BEOL processing, after the VCPA 100 has been fabricated. The GBLs 1502 of the lower GBL layer 1504 are formed in one or more of the FEOL metallization layers 1312 during FEOL processing or, subsequently, in one or more other metal layers formed above the top FEOL portion but below the VCPA 100 during BEOL processing.

Figure 16B:
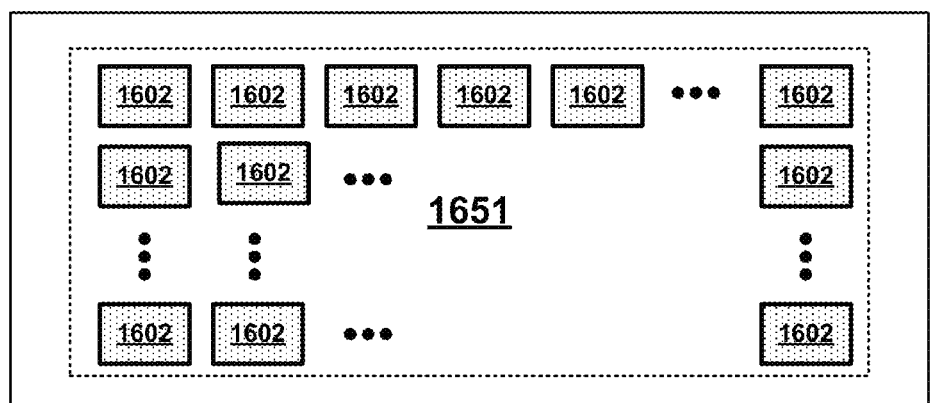
FIG. 16B is a top plan view of FEOL select transistors positioned on a substrate and positioned directly under and completely within an area footprint of a BEOL VCPA fabricated directly over the substrate, according to one embodiment of the present invention.

FIG. 16B is a top plan view of floor planning (e.g., layout or positioning) of the select transistors 1602 relative to the footprint 1651 of the BEOL VCPA. Footprint 1651 is within the die area of the substrate 1306 and the select transistors 1602 which are fabricated FEOL with logic circuitry 1304 are positioned in the FEOL layer entirely within the footprint 1651 so that all of the select transistors 1602 are positioned beneath the VCPA 100 and are electrically coupled (e.g., 1510, 1504, 1501) with their respective vertical lines 1505 and 1508. Placing the select transistors 1602 within the footprint 1651 reduces die size and allows for reduced feature sizes (e.g., memory cells 106 having a $2F^2$ feature size).

Figure 19:
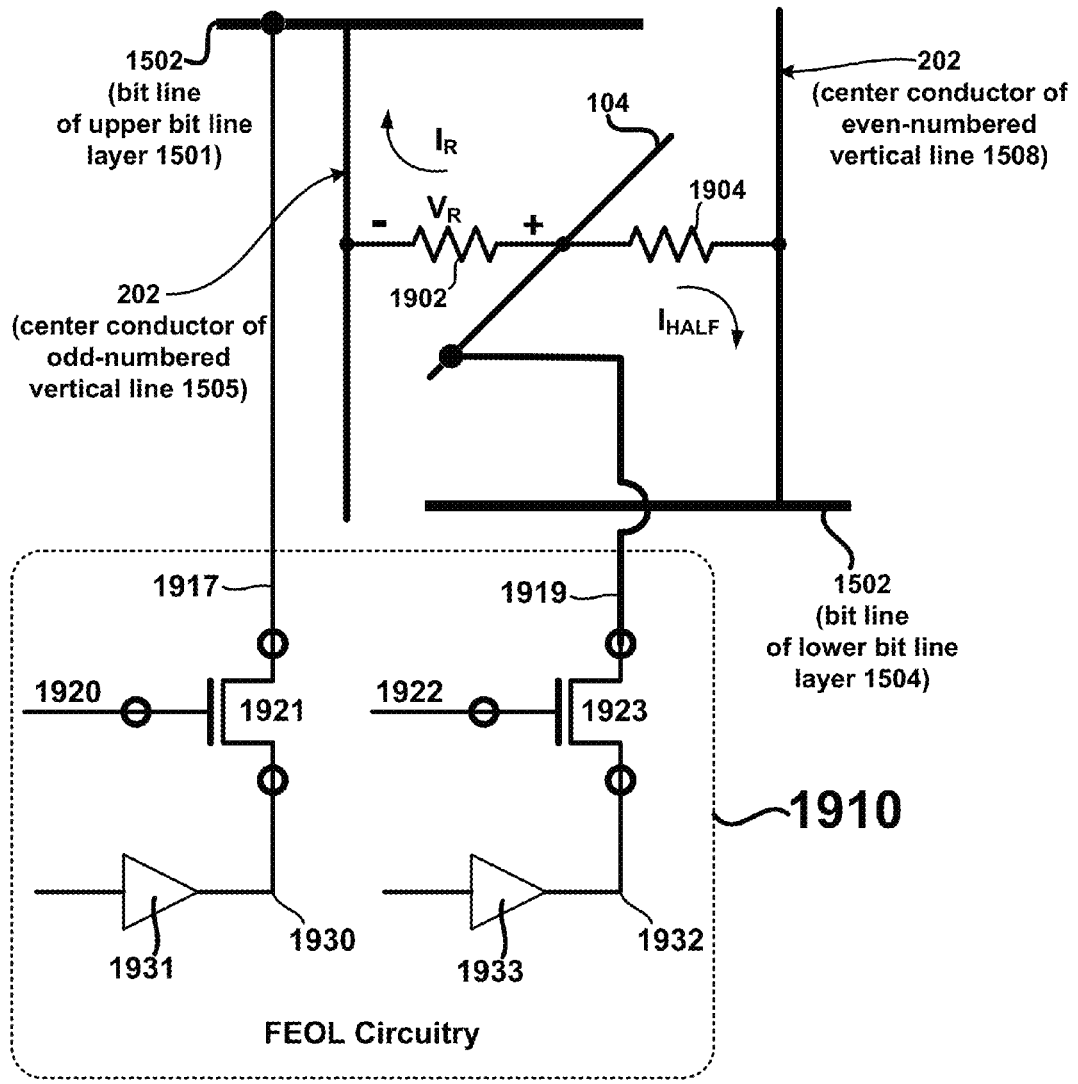
FIG. 19 is a schematic drawing depicting how use of upper and lower bit line layers in the BEOL portion of the memory structure in FIG. 16 and connections of the center electrodes of odd and even vertical lines to the upper and lower bit line layers work to divert a half-select current $I_{HALF}$ passing through a half-selected memory element away from a bit line used in reading a selected memory element.

FIG. 19 is a schematic drawing illustrating how using the upper and lower GBL layers 1501 and 1504 and alternating local bitline connections aid in reading a selected memory cell 1902. A read current $I_R$ passing through the selected memory cell 1902 is directed vertically in the +z direction along the center conductor 202 (i.e., the LBL) of its associated vertical line 102, horizontally through a GBL 1502 of one an upper GBL layer 1501, and finally vertically in the −z direction through a conductive via 1510 and/or horizontal interconnect (if necessary) that is/are electrically coupled to a select transistor 1602 in the underlying FEOL portion 1501. At the same time, an undesired half-select cell current $I_{HALF}$ passing through the half-selected memory cell 1904 on the opposing side of the selected horizontal line 104 is diverted through a different GBL 1502 in the lower GBL layer 1504. Diverting the half-select cell current $I_{HALF}$ away from the GBL 1502 used in reading the selected memory cell 1902 allows the stored memory state of the selected memory cell 1902 to be read without being adversely influenced by the half-select cell current $I_{HALF}$, even though the selected and half-selected memory cells 1902 and 1904 share the same horizontal line 104.

FIG. 19 also depicts how FEOL circuitry 1910 may be implemented to perform data operations such as read and write on selected memory cells. Here, nodes 1920 and 1919 of FETs 1921 and 1923 can be activated to electrically couple voltage drivers 1931 and 1933 to terminals of the selected memory element 1902 to apply read voltage $V_R$ across the selected memory element 1902 thereby generating the read current $I_R$ in memory element 1902 and half-select current $I_{HALF}$ in half-selected memory element 1904.

In the exemplary memory structure 1500 shown and described in FIGS. 15-19 above, the select transistors 1602 used to couple or decouple the center conductors 202 of the vertical lines 102 to decoding or sense circuits in the logic circuitry 1304 are formed in the underlying FEOL portion 1501. Fabricating the select transistors 1602 in the FEOL portion 1501 among all of the other circuit elements of the logic circuitry 1304 without having to increase the footprint of the VCPA 100 can be challenging since the substrate 1306 beneath the VCPA 100 has only a limited area. This problem becomes even more challenging the higher the capacity the VCPA 100 is. Higher capacity VCPAs of the same footprint have a greater number of memory layers 103 and, consequently, longer vertical lines 102 and a greater number of memory cells 106 connected to each vertical line 102. However, the lengths of the vertical lines 102 and the number of memory cells 106 that may be connected to each vertical line 102 (i.e., the maximum memory cell 106 to vertical line 102 ratio) are limited by the amount of tolerable voltage drop along each vertical line 102 and the amount of leakage current that can be tolerated from half-selected and partially-selected memory cells associated with the vertical lines 102 during data operations. To avoid exceeding these length and memory-cell-to-vertical-line ratio limits, the vertical lines 102 can be segmented and connected to additional select transistors 1602 when the limits are reached. Alternatively, memory capacity can be increased by stacking multiple VCPAs 100 one over the other in the vertical (i.e., +z direction), such that each VCPA 100 has vertical lines 102 that do not exceed either of these limits. Unfortunately, both approaches to increasing memory capacity require a greater number of select transistors 1602. While the number of excess select transistors may not be a problem in all circumstances, in circumstances where the available area needed to accommodate the additional select transistors is severely constrained, the size of the select transistors 1602 must be shrunk, which requires a more aggressive and expensive semiconductor manufacturing process, or the footprint of the memory structure must be increased. In some cases, neither of these alternatives is particularly desirable.

Figure 20:
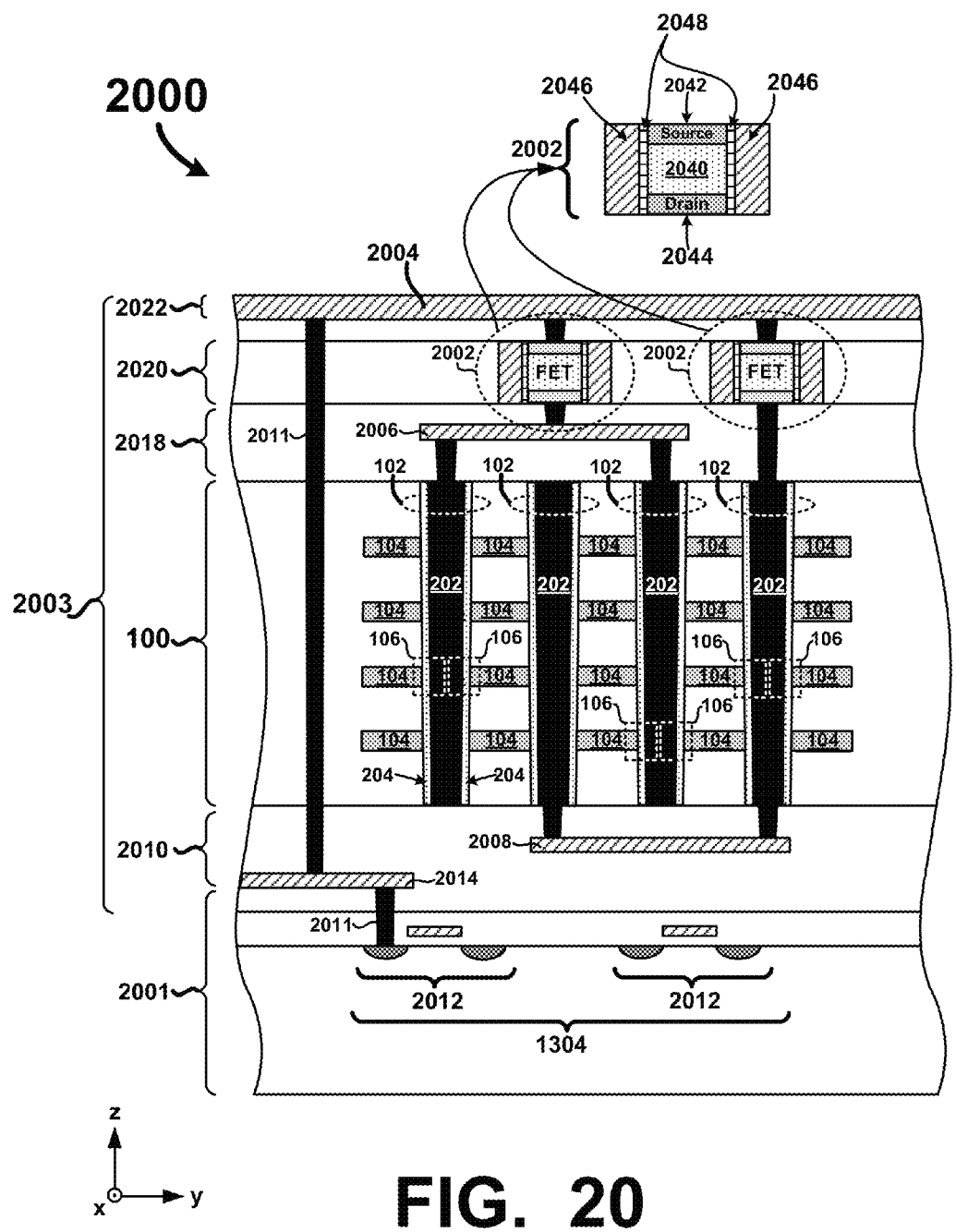
FIG. 20 is a sectional drawing of a memory structure that utilizes BEOL vertical field-effect transistors (FETs) formed in BEOL transistor layers above a VCPA to selectively couple the center conductors (i.e., local bitlines) of vertical lines in the VCPA to global bitlines in an overlying global bitline layer, according to an embodiment of the present invention.
Figure 21:
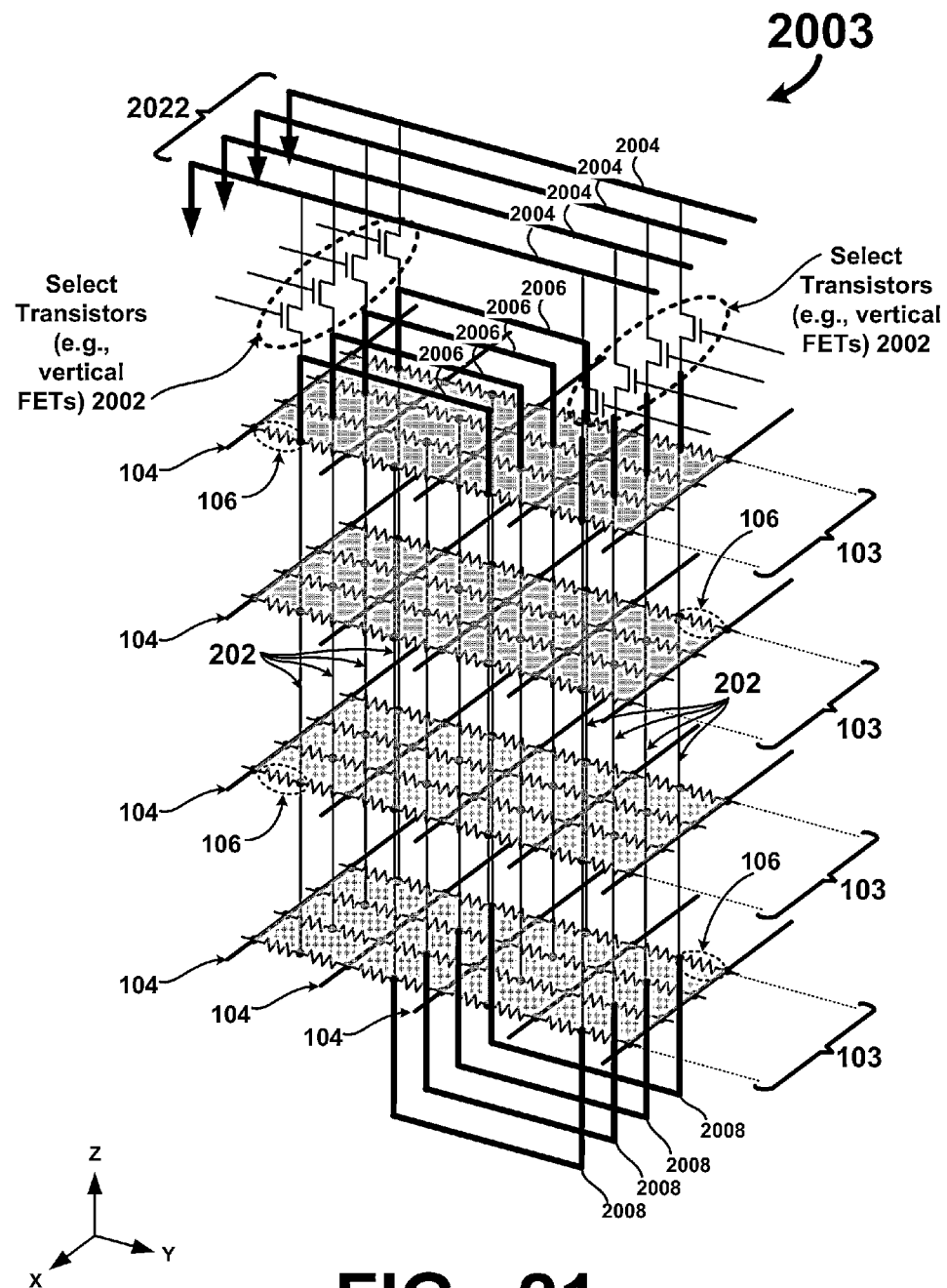
FIG. 21 is a schematic, perspective view of the BEOL portion of the memory structure in FIG. 20.

FIGS. 20 and 21 are sectional and schematic perspective drawings of a memory structure 2000 (FIG. 20) and the BEOL portion 2003 thereof (FIG. 21), according to an embodiment of the invention that avoids the problem of accommodating a large number of select transistors 1602 in the underlying FEOL portion 2001. According to this embodiment of the invention, rather than fabricating the select transistors in the FEOL portion 2001, the select devices (e.g., transistor(s), diode(s), NODs, MIMs, etc.) are fabricated in BEOL layers 2020 above the VCPA 100. For purposes of explanation, the select devices comprise FETs fabricated in a BEOL transistor layer above the VCPA 100. However, other types of FETs or other non-FET select devices may be alternatively used, as was alluded to above. The center conductors 202 (i.e., LBLs) of two or more alternating (or non-adjacent) vertical lines 102 (e.g. two or more "odd" vertical lines) in a given left-to-right rank (i.e., column) of vertical lines are selectively electrically coupled, via interconnect 2006 in an upper interconnect layer 2018, to a GBL 2004 in a GBL layer 2022 using a select device 2002 formed in the transistor layers 2020. The center conductors 202 of two or more different alternating or non-adjacent vertical lines 102 (e.g., two or more "even" vertical lines) in the same left-to-right rank of vertical lines (i.e., the same column of vertical lines) are selectively coupled to the same GBL 2004 using a different one of the select device 2002, via interconnect 2008 in a lower interconnect layer 2010. The center conductors 202 of the vertical lines 102 in the remaining columns of vertical lines 102 are selectively coupled to other GBLs 2004 of the GBL layer 2022 in a similar manner, as can be best seen in the schematic perspective drawing of the BEOL portion 2003 of the memory structure 2000 in FIG. 21. It should be mentioned that whereas only four vertical lines per column of vertical lines 102 is shown in FIGS. 20 and 21, an actual memory structure would have hundreds, thousands or more of vertical lines per left-to-right rank, as was explained above. Accordingly, in an actual memory structure there would typically be many more BEOL select devices 2002 in BEOL transistor layers 2020. Further, whereas each select device 2002 in FIGS. 20 and 21 is configured to selectively couple the center conductors 202 of just two non-adjacent vertical lines to a common GBL 2004, each select device 2002 could alternatively be configured to selectively couple the center conductors 202 of more than two non-adjacent vertical lines 102 to a common GBL 2004, depending on the number of memory layers 103 and/or how much leakage current from half-selected and partially-selected memory cells can be tolerated during data operations.

When FETs are used to implement the select devices 2002 of the memory structure 2000 and other embodiments of the invention, they may comprise planar or vertical FETs fabricated using FET forming techniques that are well known to those of ordinary skill in the art. In the embodiment shown in FIGS. 20 and 21, each select device 2002 is formed as a vertical FET, such as a gate-all-around FET (i.e., "donut" FET), FinFET, or dual- or multi-gate FET. However, any suitable type of FET may be used. As shown in the magnified view of the vertical FET 2002 in FIG. 20, each vertical FET 2002 may comprise a semiconducting channel region 2040 of a first conductivity type (e.g., n-type or p-type) bounded on top and bottom by semiconducting source and drain regions 2042 and 2044 of opposite conductivity type; a gate 2046; and a gate dielectric layer 2048 formed between the gate 2046 and channel region 2040 that extends vertically between the source and drain regions 2042 and 2044. The gates 2046 of the vertical FETs 2002 are electrically connected to FEOL decoding circuitry (part of FEOL logic circuitry 1304) in the underlying FEOL portion 2001, by way of conductive vias (not shown in FIG. 20) formed through the various layers of the BEOL and FEOL portions 2003 and 2001. The vertical FETs 2002 function as switches that turn ON and OFF in response to signals generated by the decoding circuitry. It should be reiterated that although FETs are used as the selection devices 2002 in this and other exemplary embodiments of the invention, other types of selection devices such as bipolar junction transistors, thin-film diodes, metal-insulator-metal devices (MIMs), etc. may be alternatively used.

Figure 22:
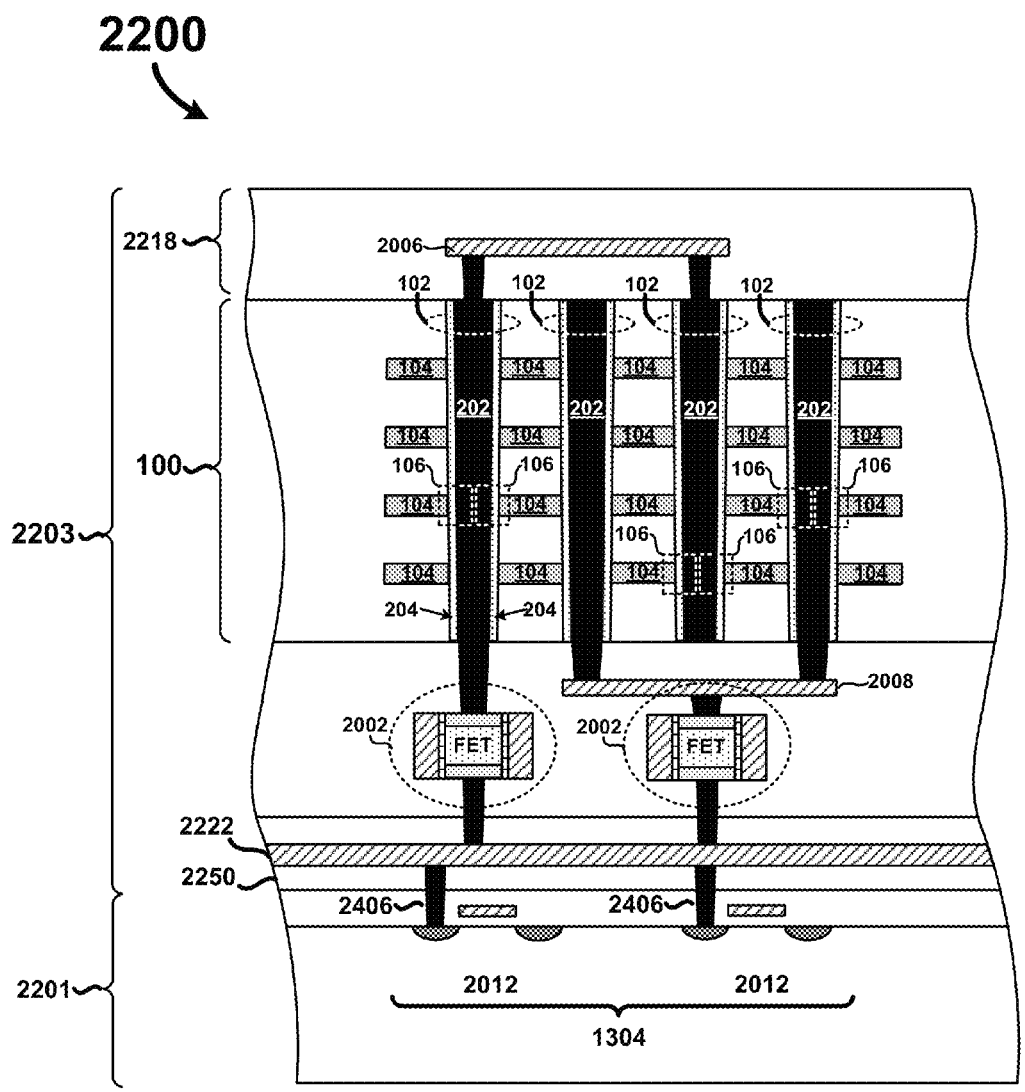
FIG. 22 is a sectional drawing of a memory structure that utilizes BEOL vertical field-effect transistors (FETs) formed in BEOL transistor layers below a VCPA to selectively couple the center conductors (i.e., local bitlines) of vertical lines in the VCPA to global bitlines in an underlying global bitline layer, according to an embodiment of the present invention.
Figure 23:
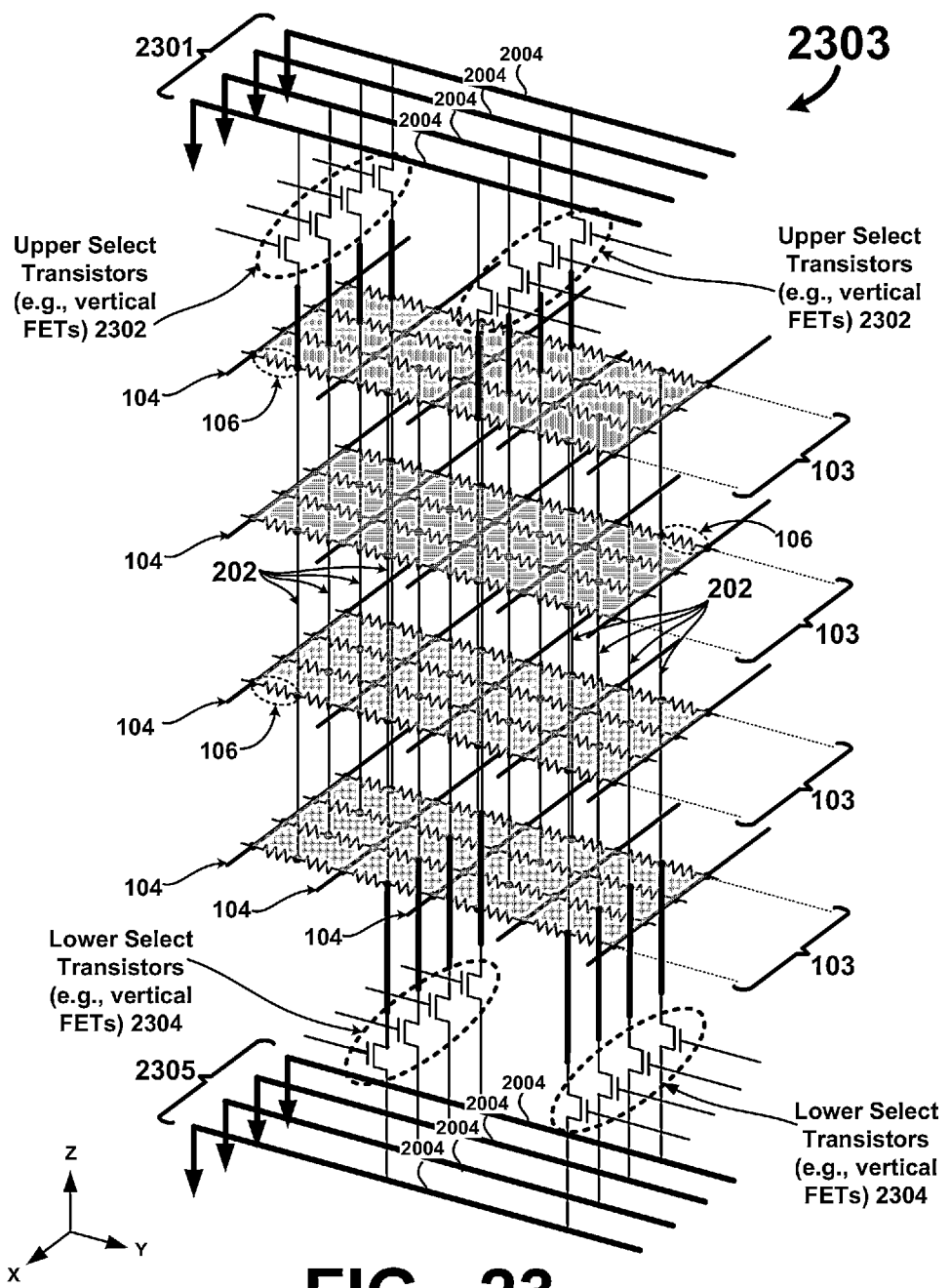
FIG. 23 is a schematic, perspective view of the BEOL portion of a memory structure including "upper" vertical select transistors that selectively couple the center conductors (i.e. local bitlines) of "odd" vertical lines to global bitlines in an upper global bitline layer and "lower" vertical select transistors that selectively couple the center conductors (i.e., local bitlines) of "even" vertical lines to global bitlines in a lower global bit line layer, according to one embodiment of the invention.

In the exemplary memory structure 2000 in FIG. 20, the select transistors 2002 are formed in transistor layers 2020 above the VCPA 100. In other embodiments of the invention, the select transistors 2002 are formed in one or more transistor layers below the VCPA 100, between the upper layer of the FEOL portion 2001 and the bottom of the VCPA 100 (as depicted in FIG. 22), below the VCPA 100 in the FEOL portion 2001, both above and below the VCPA 100 (as depicted in FIG. 23), or around the periphery of the VCPA 100 (either in the FEOL portion 2001 or BEOL portion 2003). Similarly, the GBL layers 2022 are formed above the VCPA 100, in one or more GBL layers between the lowermost layer of the VCPA 100 and the uppermost layer of the FEOL portion 2001, or in the FEOL portion 2001 itself. In the example shown in FIG. 23, "upper" select transistors 2302 operate to selectively couple the center conductors 202 of two or more alternating or non-adjacent vertical lines 102 (e.g., "odd" vertical lines) to GBLs 2004 in an upper GBL layer 2301, and "lower" select transistors 2304 operate to selectively couple the center conductors 202 of two or more different alternating or non-adjacent vertical lines 102 (e.g., "even" vertical lines) to GBLs 2004 in a lower GBL layer 2305.

Figure 24:
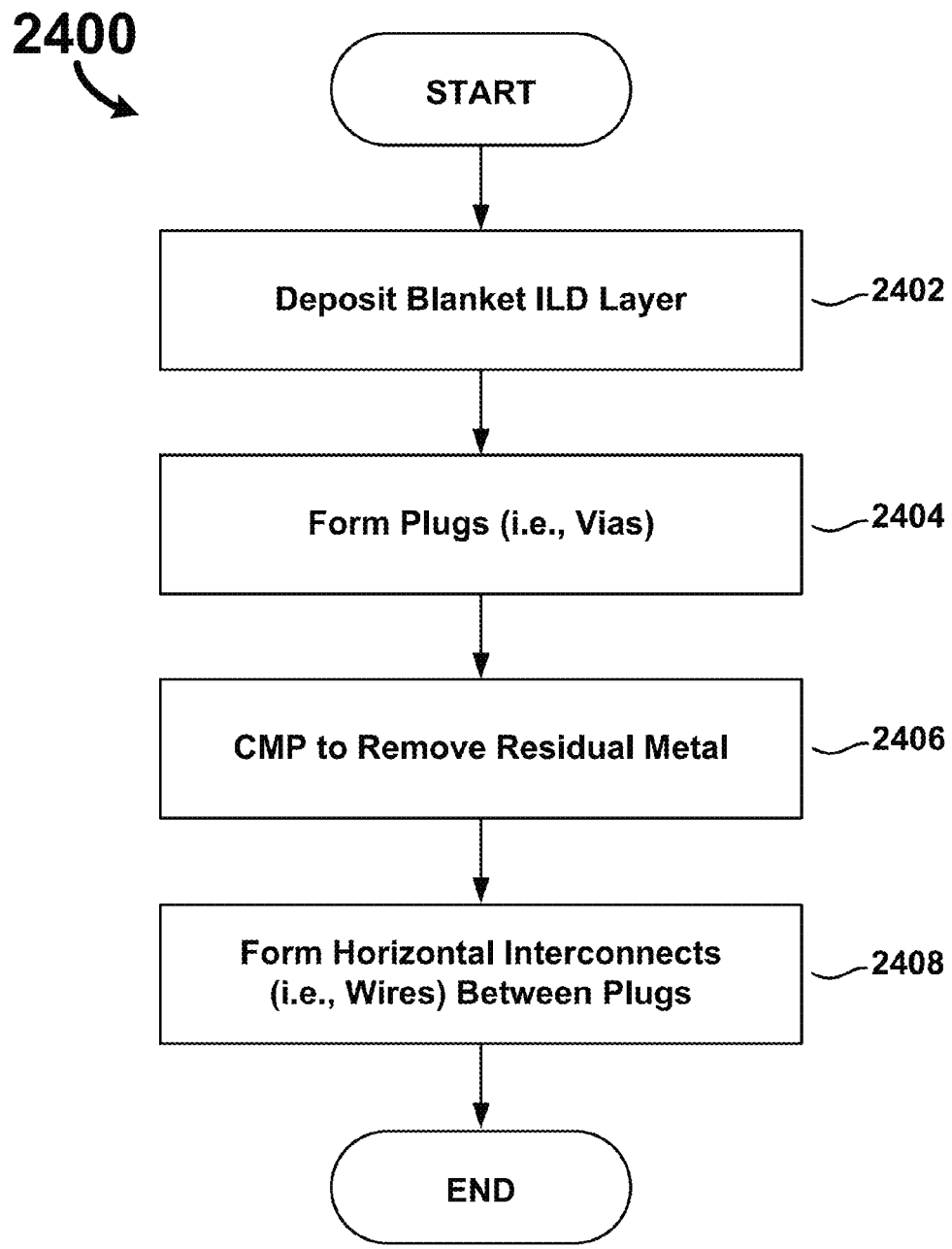
FIG. 24 is a flowchart depicting a method of forming electrical interconnect salient steps of an exemplary interconnect formation method that may be used to form the electrical interconnect between select transistors, center conductors (i.e., local bitlines), global bitlines, and FEOL logic circuitry in the FEOL portion of the VCPA in FIG. 22.

FIG. 24 is a flowchart depicting salient steps of an exemplary interconnect formation method 2400 that may be used to form the electrical interconnect between the select transistors 2002, center conductors 202, GBLs of GBL layer(s) 2222, and FEOL logic circuitry 1304 in FEOL portion 2201. The method 2400 is described in reference to the VCPA structure 2200 in FIG. 22. However, it can be readily modified and adapted and used to form the electrical interconnect in the other VCPA structures disclosed herein. First, in step 2402, a blanket inter-dielectric (ILD) layer 2250 is deposited over the uppermost layer of the FEOL portion 2201. Next, in step 2404, plugs (i.e., vias) 2252 are formed through the ILD layer 2250 by: patterning plug openings in a first lithography step, etching plug recesses into the resulting plug openings (e.g., using a dielectric ion etch), and depositing a metal (e.g., Cu) barrier, seed and bulk metal into the plug recesses. The plugs 2404 serve to electrically connect horizontally conducting lines (e.g., the GBLs of GBL layer(s) 2222) and/or devices (e.g., select FETs 2002) in given layers of the VCPA structure 2200 to conducting lines and/or devices in other layers of the VCPA structure 2200 (e.g., to FEOL logic circuitry 1304 in FEOL portion 2201). Following step 2004, in step 2406 metal remaining on the surface of the structure is removed, for example, using a CMP process. Finally, in step 2408 horizontal interconnects (i.e., "wires") are formed between metal plugs 2404 by first patterning trench openings using a second lithography step, etching trenches according to the defined patterns (e.g., using a dielectric ion etch), and depositing a metal (e.g., Cu) barrier, seed and bulk metal into the trenches. Steps 2402-2408 are then repeated or similar steps performed, as necessary, to form additional plugs and horizontal wires, as will be appreciated and understood by those of ordinary skill in the art.

Figure 25:
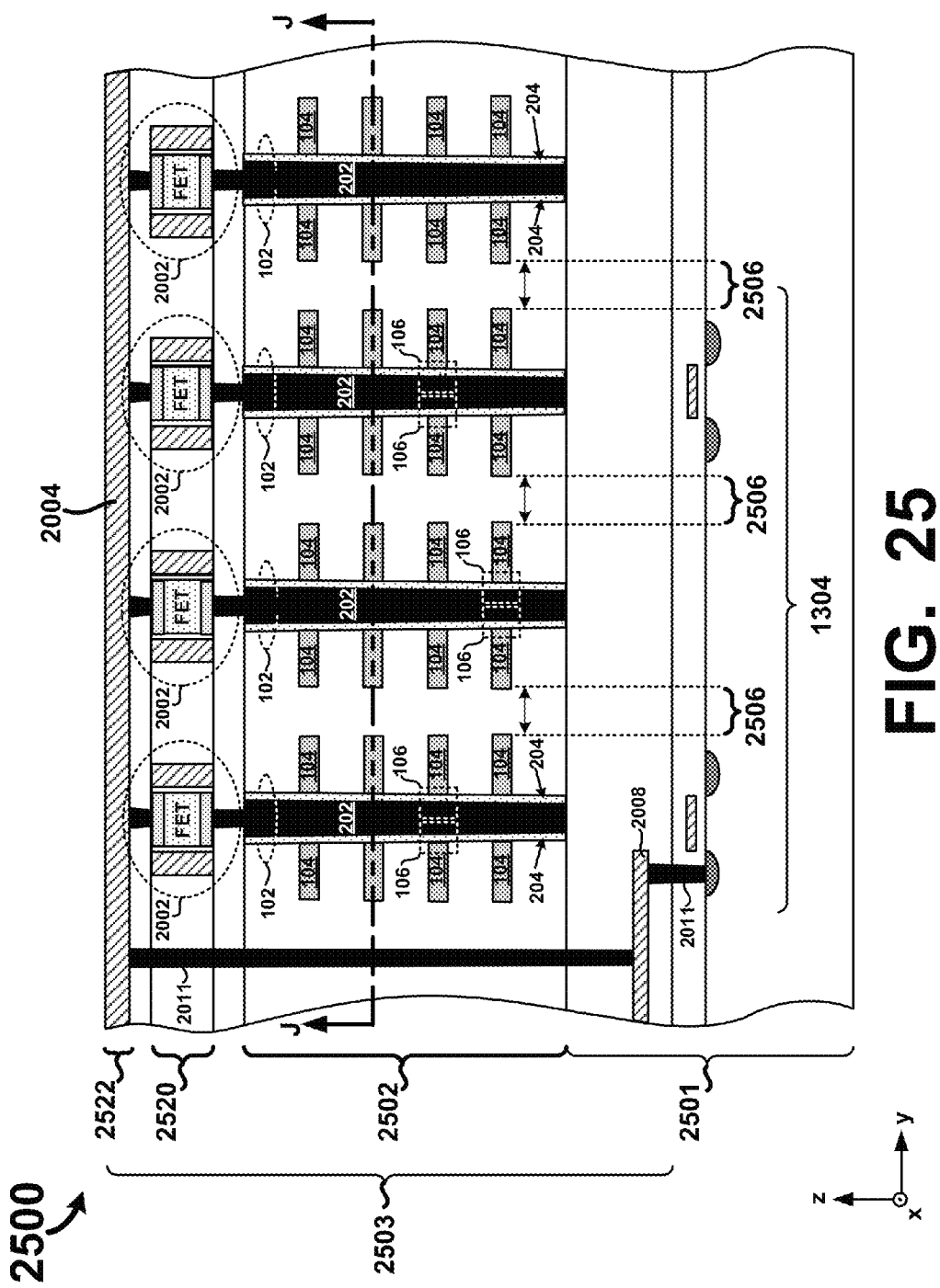
FIG. 25 is a sectional view of a memory structure according to another embodiment of the invention that includes vertical BEOL FETs, similar to as the memory structure in FIGS. 16-23, and a VCPA structure having a memory cell footprint of 4F².
Figure 26:
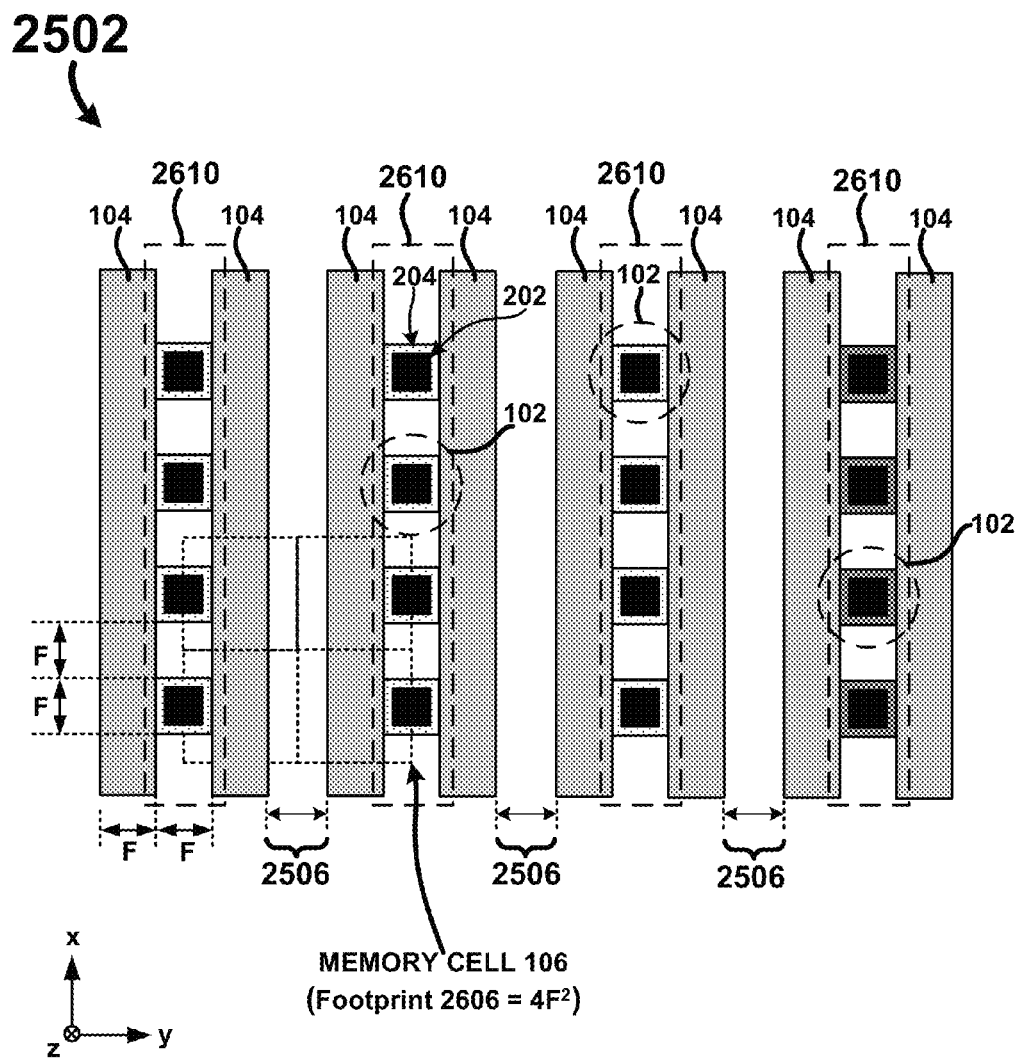
FIG. 26 is sectional view of the memory structure in FIG. 25 through cutting plane J-J.
Figure 27:
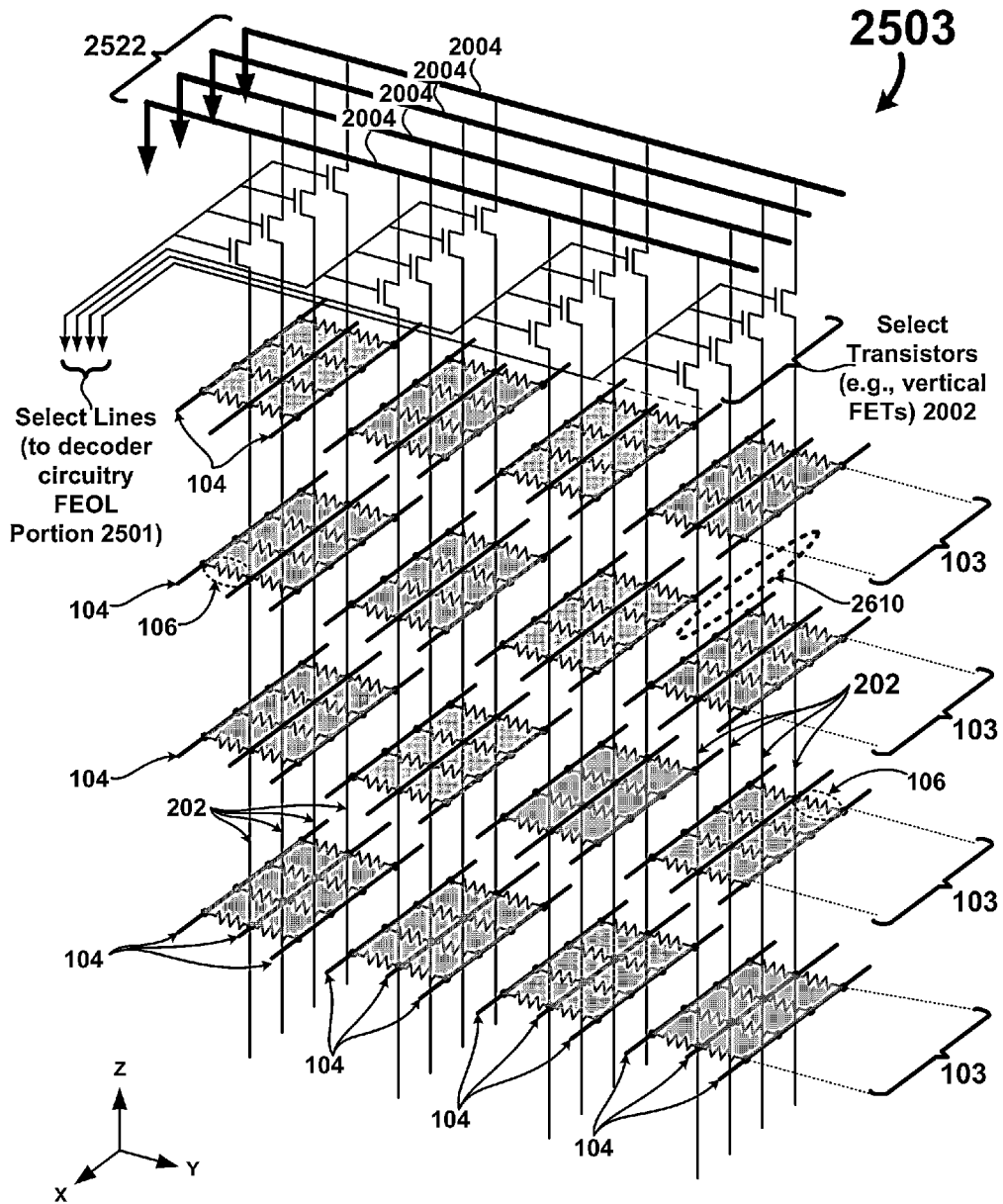
FIG. 27 is a schematic perspective view of a BEOL portion of the memory structure depicted in FIGS. 25 and 26.

In the VCPAs of the exemplary VCPA structures described above, a row 108 of vertical lines 102 is positioned between each consecutive pair of horizontal lines 104 and the horizontal lines 104 are configured so that each horizontal line 104 connects to a vertical line 102 on each of its sides (i.e., edges)—one to the left and another to the right. (See, for example, FIGS. 1 and 2.) Interleaving the vertical and horizontal lines 102 and 104 in that manner yields a memory cell footprint of just $2F^2$ (see FIGS. 3 and 6 above), which in most circumstances is highly desirable. FIGS. 25-27 depict a memory structure 2500 having a VCPA 2502, according to another embodiment of the invention. Like the VCPA 100 described above, the VCPA 2502 has vertical lines 102 with center conductors 202 surrounded by memory film layer(s) 204, horizontal lines 104, and memory cells 106, which, like the VCPA 100, may comprise resistive change memory cells (like or similar to the CMO-based memory cell 606 described in FIGS. 6-7), phase-change memory cells, magnetoresistive memory cells, ferroelectric memory cells, conductive bridge memory cells, carbon nanotube based memory cells, etc. However, instead of a row of vertical lines 102 being positioned between each consecutive pair of horizontal lines 104, a row 2610 of vertical lines 102 is positioned between every other consecutive pair of horizontal lines 104 (see FIG. 26). The method of manufacturing the VCPA 2502 is substantially similar to as described above (see FIG. 11 and accompanying drawings and description), except that the trenches and holes formed in spaces 2506 are filled with a dielectric prior to completing formation of the vertical line openings 1210 and vertical lines 102. This results in a larger memory cell footprint 2606 (see FIG. 25) of $4F^2$ (i.e., a factor of two larger than the $2F^2$ footprint 206 of the VCPA 100) due to the resulting spaces 2506 and forming the vertical lines 102 only between every other consecutive pair of horizontal lines 104. The GBLs 2004 of GBL layer(s) 2522, like the $2F^2$ VCPA structures described above, can be fabricated above the VCPA 2502 (as depicted in FIGS. 25-27), in the FEOL portion 2501, or in GBL layers formed both above and below the VCPA 2502.

If maximum memory cell density is the primary objective, the increased cell footprint of $4F^2$ of the memory structure 2500 is not particularly desirable (compared to the previously described structures, which have a cell footprint half the size), especially since the overall memory structure footprint is multiplicatively increased by the presence of multiple spaces 2506. However, in circumstances where it is difficult or not possible to fabricate all or substantially all of the logic circuitry 1304 directly beneath the VCPA 2502, as in the other memory structures described above, the increased footprint may be acceptable and in some cases even desirable. Like the memory structure depicted in FIGS. 20-21, the select devices 2002 (e.g., vertical FETs) used to selectively couple the center conductors 202 of the vertical lines 202 to the GBLs 2004 may be formed in BEOL transistor layers 2520 above the VCPA 2502. Alternatively, they may be formed in transistor layers between the lowermost memory layer 103 of the VCPA 2502 and the uppermost layer of the FEOL portion 2501 (like the memory structure 2203 in FIG. 22), within the FEOL portion 2501, or in transistor layers both above and below the VCPA 2502 (like the memory structure 2303 in FIG. 23).

Although the present invention has been described in detail with reference to certain exemplary embodiments, various changes in form and detail are possible. Accordingly, the spirit and scope of the invention should not be construed as being limited to specific details or features of the exemplary embodiments or to any disclosed embodiment in particular but instead should be construed in reference to the appended claims, including the full scope of equivalents to which such claims are entitled.

What is claimed is:

1. A method of manufacturing a memory structure, comprising:
    forming a plurality of vertically-stacked horizontal line layers, each horizontal line layer including a plurality of electrically conductive horizontal lines;
    interleaving a plurality of electrically conductive vertical lines with the electrically conductive horizontal lines such that the electrically conductive vertical lines extend through the horizontal line layers in between rows of electrically conductive horizontal lines except along edges of the horizontal line layers;
    forming a resistive memory film at and between the electrically conductive vertical lines and the electrically conductive horizontal lines to create a memory array of two-terminal memory elements;
    each electrically conductive vertical line disposed to serve as a shared bit line for accessing memory elements facing left with respect to a centerline of the electrically conductive vertical line and also as a shared bit line for accessing memory elements facing right with respect to the centerline of the electrically conductive vertical line;
    each electrically conductive horizontal line disposed to serve as a shared word line for the memory elements formed between the electrically conductive horizontal line and each electrically conductive vertical line that the electrically conductive horizontal line crosses, including at each such crossing, the left facing memory cell and the right facing memory cell, whereby the electrically conductive horizontal line accesses two rows of memory cells;
    fabricating a first set of global bit lines in front end of line (FEOL) circuitry below said memory array, wherein each one of the first set of global bit lines is electrically connected to a first subset of alternate ones of the electrically conductive vertical lines;
    fabricating a second set of global bit lines in back end of line (BEOL) circuitry above the memory array, wherein each one of the second set of global bit lines is electrically connected to a second subset of alternate ones of the electrically conductive vertical lines, wherein the first and second subsets are mutually exclusive; and
    fabricating:
        a first set of selection devices in the FEOL circuitry below said memory array, the first set of selection devices operable to selectively electrically couple the first subset of electrically conductive vertical lines to the first set of global bit lines; and
        a second set of selection devices in the BEOL circuitry above the memory array, the second set of selection devices operable to selectively electrically couple the second subset of the electrically conductive vertical lines to the second set of global bit lines; and
        an interconnect structure that electrically connects the first set and the second set of selection devices to the first set and the second set of global bit lines, respectively.

2. The method of claim 1, including segmenting at least one of the electrically conductive vertical lines and coupling each of the segments to a corresponding select transistor in order to limit a length of the electrically conductive vertical line.

3. The method of claim 1, wherein interleaving said plurality of electrically conductive vertical lines with the plurality of electrically conductive horizontal lines includes forming a row of electrically conductive vertical lines between every horizontally-adjacent pair of electrically conductive horizontal lines in each of said horizontal line layers.

4. The method of claim 3, wherein said memory array has a memory cell footprint of $2F^2$, where F is a minimum feature size.

5. The method of claim 1, wherein forming a memory film comprises forming one or more resistive change memory films.

6. The method of claim 5, wherein forming one or more resistive change memory films comprises forming one or more insulating metal oxide layers and one or more conductive metal oxide layers.

7. A method of manufacturing a memory structure, comprising:
    forming a plurality of vertically-stacked horizontal line layers, each horizontal line layer including a plurality of electrically conductive horizontal lines;
    interleaving a plurality of electrically conductive vertical lines with the electrically conductive horizontal lines such that the electrically conductive vertical lines extend through the horizontal line layers in between rows of electrically conductive horizontal lines except along edges of the horizontal line layers;
    forming a resistive memory film at and between the electrically conductive vertical lines and the electrically conductive horizontal lines to create a memory array of two-terminal memory elements;

each electrically conductive vertical line disposed to serve as a shared bit line for accessing memory elements facing left with respect to a centerline of the electrically conductive vertical line and also as a shared bit line for accessing memory elements facing right with respect to the centerline of the electrically conductive vertical line;

each electrically conductive horizontal line disposed to serve as a shared word line for the memory elements formed between the electrically conductive horizontal line and each electrically conductive vertical line that the electrically conductive horizontal line crosses, including at each such crossing, the left facing memory cell and the right facing memory cell, whereby the electrically conductive horizontal line accesses two rows of memory cells;

fabricating a first set of global bit lines above said memory array, wherein each one of the first set of global bit lines is electrically connected to a first subset of alternate ones of the electrically conductive vertical lines;

fabricating a second set of global bit lines below said memory array, wherein each one of the second set of global bit lines is electrically connected to a second subset of alternate ones of the electrically conductive vertical lines, wherein the first and second subsets are mutually exclusive; and fabricating:
- a first set of selection devices above said memory array, the first set of selection devices operable to selectively electrically couple the first subset of electrically conductive vertical lines to the first set of global bit lines;
- a second set of selection devices below said memory array, the second set of selection devices operable to selectively electrically couple the second subset of the electrically conductive vertical lines to the second set of global bit lines; and
- an interconnect structure that electrically connects the first set and the second set of selection devices to the first set and the second set of global bit lines, respectively.

8. The method of claim 7, wherein interleaving said plurality of electrically conductive vertical lines with the plurality of electrically conductive horizontal lines includes forming a row of electrically conductive vertical lines between only every other horizontally-adjacent pair of electrically conductive horizontal lines in each of said horizontal line layers.

9. The method of claim 8, wherein said memory array has a memory cell footprint of $4F^2$, where F is a minimum feature size.

10. The method of claim 7, further comprising fabricating the first set of global bit lines in an upper global bit line (GBL) layer above said memory array, and fabricating the second set of global bit lines in a lower GBL layer below the memory array.

11. A memory apparatus comprising:
a plurality of vertically-stacked horizontal line layers, each horizontal line layer including a plurality of electrically conductive, substantially parallel horizontal lines;
a plurality of electrically conductive vertical lines interleaved with the electrically conductive horizontal lines such that the electrically conductive vertical lines extend through the horizontal line layers; and each electrically conductive vertical line extends in between a pair of adjacent electrically conductive horizontal lines disposed on the same horizontal line layer;
for each electrically conductive vertical line, a first resistive memory film formed between the corresponding electrically conductive vertical line and a first one of the pair of adjacent electrically conductive horizontal lines so as to form a first resistive memory cell;
for each electrically conductive vertical line, a second resistive memory film formed between the corresponding electrically conductive vertical line and the other one of the pair of adjacent electrically conductive horizontal lines so as to form a second resistive memory cell;
wherein each electrically conductive vertical line is disposed to serve as a shared first terminal for accessing memory cells facing left with respect to a centerline of the electrically conductive vertical line and also as a shared first terminal for accessing memory elements facing right with respect to the centerline of the electrically conductive vertical line;
each electronically conductive horizontal line is disposed to serve as a shared word line for the memory elements formed between the electrically conductive horizontal line and each electrically conductive vertical line that the electrically conductive horizontal line crosses, including at each such crossing, the left facing memory cell and the right facing memory cell, whereby the electrically conductive horizontal line accesses two rows of memory cells;
a first set of global bit lines formed in a first upper layer above the horizontal line layers, the first set of global bit lines electrically coupled to a first subset of alternate ones of the electrically conductive vertical lines, selectively, by operation of a first set of selection devices formed in the first upper layer; and
a second set of global bit lines formed in a first lower layer below the horizontal line layers, the second set of global bit lines electrically coupled to a second subset of alternate ones of the electrically conductive vertical lines, selectively, by operation of a second set of selection devices formed in the first lower layer, wherein the first and second subsets are mutually exclusive.

12. The memory apparatus of claim 11, wherein:
the first subset of global bit lines are formed in a second upper global bit line (GBL) layer of the first upper layer, and the second subset of global bit lines are formed in a second lower GBL layer of the first lower layer.

13. The memory apparatus of claim 12, wherein the first and second resistive memory films are formed on opposite sides of the electrically conductive vertical line.

14. The memory apparatus of claim 12, wherein the first and second resistive memory films are formed along respective edges of the pair of adjacent electrically conductive horizontal lines.

15. The memory apparatus of claim 12, further comprising:
a first interconnect structure arranged to electrically connect the first set of selection devices to the first set of global bit lines; and
a second interconnect structure arranged to electrically connect the second set of selection devices to the second set of global bit lines.

16. An electronic device, comprising:
a vertical-cross point array, comprising:
a plurality of first vertically-stacked horizontal line layers, each first horizontal line layer including a plurality of electrically conductive, substantially parallel horizontal lines;
a plurality of electrically conductive vertical lines interleaved with the electrically conductive horizontal lines such that the electrically conductive vertical lines extend through the first horizontal line layers; and each electrically conductive vertical line extends in between a pair of adjacent electrically conductive horizontal lines disposed on the same first horizontal line layer;

for each electrically conductive vertical line, a first resistive memory film formed between the corresponding electrically conductive vertical line and a first one of the pair of adjacent electrically conductive horizontal lines so as to form a first resistive memory cell;

for each electrically conductive vertical line, a second resistive memory film formed between the corresponding electrically conductive vertical line and the other one of the pair of adjacent electrically conductive horizontal lines so as to form a second resistive memory cell;

wherein each electrically conductive vertical line is disposed to serve as a shared first terminal for accessing memory cells facing left with respect to a centerline of the electrically conductive vertical line and also as a shared first terminal for accessing memory elements facing right with respect to the centerline of the electrically conductive vertical line; and each electrically conductive horizontal line is disposed to serve as a shared word line for the memory elements formed between the electrically conductive horizontal line and each electrically conductive vertical line that the electrically conductive horizontal line crosses, including at each such crossing, the left facing memory cell and the right facing memory cell, whereby the electrically conductive horizontal line accesses two rows of memory cells;

first and second sets of global bit lines electrically coupled to the electrically conductive vertical lines, selectively, by operation of selection devices, wherein each one of the first set of global bit lines is formed above the vertical-cross point array and is electrically connected to a first subset of alternate ones of the electrically conductive vertical lines and each one of the second set of global bit lines is formed below the vertical-cross point array and is electrically connected to a second subset of alternate ones of the electrically conductive vertical lines, wherein the first and second subsets are mutually exclusive; and an interconnect structure spanning a distance between two points and arranged to electrically connect at least one global bit line of the first set to at least one of the selection devices, wherein a first point of the two points is below the vertical-cross point array and a second point of the two points is above the vertical-cross point array.

17. The electronic device of claim 16, wherein the interconnect structure further comprises a metal interconnect positioned orthogonally to a first via of the interconnect structure and second via of the interconnect structure.

* * * * *